US010541338B2

(12) United States Patent
Bolotnikov et al.

(10) Patent No.: US 10,541,338 B2
(45) Date of Patent: Jan. 21, 2020

(54) EDGE TERMINATION DESIGNS FOR SILICON CARBIDE SUPER-JUNCTION POWER DEVICES

(71) Applicant: GENERAL ELECTRIC COMPANY, Schenectady, NY (US)

(72) Inventors: Alexander Viktorovich Bolotnikov, Niskayuna, NY (US); Peter Almern Losee, Clifton Park, NY (US); David Alan Lilienfeld, Niskayuna, NY (US); James Jay McMahon, Clifton Park, NY (US)

(73) Assignee: GENERAL ELECTRIC COMPANY, Niskayuna, NY (US)

( * ) Notice: Subject to any disclaimer, the term of this patent is extended or adjusted under 35 U.S.C. 154(b) by 0 days.

(21) Appl. No.: 16/060,549

(22) PCT Filed: Dec. 15, 2015

(86) PCT No.: PCT/US2015/065881
§ 371 (c)(1),
(2) Date: Jun. 8, 2018

(87) PCT Pub. No.: WO2017/105414
PCT Pub. Date: Jun. 22, 2017

(65) Prior Publication Data
US 2019/0006529 A1    Jan. 3, 2019

(51) Int. Cl.
*H01L 29/872*    (2006.01)
*H01L 29/66*    (2006.01)
(Continued)

(52) U.S. Cl.
CPC ........ *H01L 29/872* (2013.01); *H01L 29/0623* (2013.01); *H01L 29/0634* (2013.01);
(Continued)

(58) Field of Classification Search
CPC .............. H01L 29/872; H01L 29/0623; H01L 29/6603; H01L 29/167; H01L 29/36; H01L 29/0634; H01L 29/0619; H01L 29/1608
(Continued)

(56) References Cited

U.S. PATENT DOCUMENTS 6,037,632 A    3/2000 Omura et al.
6,642,558 B1 *  11/2003 Letavic ............... H01L 29/0619
257/219
(Continued)

OTHER PUBLICATIONS

Kosugi, Ryoji, et al.;"Development of SiC Super-Junction (SJ) Device by Deep Trench-Filling Epitaxial Growth", Silicon Carbide and Related Materials 2012, Scientific.net, Jan. 2013, pp. 785-788, vols. 740-742.
(Continued)

*Primary Examiner* — Caleen O Sullivan
(74) *Attorney, Agent, or Firm* — Fletcher Yoder, P.C.

(57) ABSTRACT

The subject matter disclosed herein relates to silicon carbide (SiC) power devices and, more specifically, to SiC super-junction (SJ) power devices. A SiC-SJ device includes a plurality of SiC semiconductor layers of a first conductivity-type, wherein a first and a second SiC semiconductor layer of the plurality of SiC semiconductor layers comprise a termination region disposed adjacent to an active region with an interface formed therebetween, an act wherein the termination region of the first and the second SiC semiconductor layers comprises a plurality of implanted regions of a second conductivity-type, and wherein an effective doping profile of the termination region of the first SiC semiconductor layer is different from an effective doping profile of the termination region of the second SiC semiconductor layer.

27 Claims, 11 Drawing Sheets

(51) Int. Cl.
    *H01L 29/36* (2006.01)
    *H01L 29/16* (2006.01)
    *H01L 29/06* (2006.01)
    *H01L 29/167* (2006.01)

(52) U.S. Cl.
    CPC ........ *H01L 29/167* (2013.01); *H01L 29/1608* (2013.01); *H01L 29/36* (2013.01); *H01L 29/6603* (2013.01)

(58) Field of Classification Search
    USPC .......................................... 257/77, 219, 341
    See application file for complete search history.

(56) References Cited

U.S. PATENT DOCUMENTS

| | | |
|---|---|---|
| 6,844,592 B2 | 1/2005 | Yamaguchi et al. |
| 7,115,475 B2 | 10/2006 | Yamaguchi et al. |
| 7,595,241 B2 | 9/2009 | Matocha et al. |
| 7,737,469 B2 | 6/2010 | Saito et al. |
| 7,948,033 B2 | 5/2011 | Hossain |
| 8,013,360 B2 | 9/2011 | Saito et al. |
| 8,476,698 B2 | 7/2013 | Guan et al. |
| 8,501,598 B2 | 8/2013 | Nogami et al. |
| 8,546,875 B1 | 10/2013 | Hirler et al. |
| 8,546,882 B2 | 10/2013 | Xiao et al. |
| 8,604,541 B2 | 12/2013 | Huang et al. |
| 2006/0043480 A1* | 3/2006 | Tsuchitani .......... H01L 29/0634 257/341 |
| 2009/0267141 A1 | 10/2009 | Matocha et al. |
| 2013/0087852 A1 | 4/2013 | Kim et al. |
| 2013/0277740 A1 | 10/2013 | Guan et al. |
| 2015/0115284 A1* | 4/2015 | Arthur ................ H01L 21/0465 257/77 |
| 2016/0380059 A1* | 12/2016 | Losee ................. H01L 29/1608 257/77 |

OTHER PUBLICATIONS

Kimoto, Tsunenobu; SiC technologies for future energy electronics, VLSI Technology (VLSIT), 2010 Symposium, IEEEXplore, Jun. 15-17, 2010, pp. 9-14, Conference Location : Honolulu.

Lorenz, L., et al.; Key power semiconductor device concepts for the next decade, Industry Applications Conference, IEEE Xplore, Oct. 13-18, 2002, pp. 564-569, vol. 1, Conference Location : Pittsburgh, PA, USA.

* cited by examiner

EDGE TERMINATION DESIGNS FOR SILICON CARBIDE SUPER-JUNCTION POWER DEVICES

BACKGROUND

The subject matter disclosed herein relates to silicon carbide (SiC) power devices and, more specifically, to SiC super-junction (SJ) power devices.

For semiconductor power devices, super-junction (also referred to as vertical charge-balance) designs offer several advantages. For example, super-junction devices demonstrate reduced on-resistance and reduced conduction losses relative to conventionally designed unipolar power devices. SiC SJ drift layers can be applied to a variety of power devices such as metal-oxide-semiconductor field-effect transistors (MOSFETs), junction field effect transistors (JFETs), bipolar junction transistors (BJTs), diodes, as well as other devices that may be useful for medium-voltage (e.g., 2 kV-10 kV) and high-voltage (e.g., greater than or equal to 10 kV) power conversion related applications.

In silicon (Si) super-junction (SJ) devices, design features such as active regions of vertical pillars may be formed/implemented either by implanting or by diffusing dopants of p-type into a Si device layer of n-type. The vertical pillars of these Si-SJ devices extend through the thickness (e.g., tens of micrometers) of the Si device layer, which can be achieved using one or both of existing Si implantation and diffusion methods. Edge termination regions in Si-SJ devices, may be implemented by ion implantation processes and diffusing dopants similar to the active cells, or by using filled trenches of silicon oxide ($SiO_2$), silicon or poly-silicon (Si). Edge termination regions generally prevent electric field crowding near the edges of the active region during reverse bias.

However, in silicon carbide (SiC), there are significant differences. For example, dopants have significantly lower diffusion coefficients than in Si. As a result, when a device design feature, such as an active region with a vertical charge-balance pillar, is to be fabricated by implanting dopants into an epitaxial layer using implantation energies typical of Si processing, the dopants are unable to penetrate as deeply into a SiC layer. For example, common high-volume ion implantation systems for Si device fabrication enable dopant implantation energies up to about 380 keV. Such implantation energies only enable dopant implantation to a maximum depth between about 0.5 µm and about 1 µm into a SiC layer. Additionally, due to technological constrains and incomplete activation of dopants, effective doping concentrations provided by both implantation doping and in-situ epitaxial growth doping while fabricating SiC devices can vary up to about 20% from the designed doping concentrations. Thus, achieving desired both n-type and p-type doping control is difficult when fabricating SiC-based super-junction power devices.

In addition, significantly higher electric fields present in SiC-SJ devices under reverse bias, prevent some of conventional Si edge termination techniques from being utilized in SiC-SJ devices. As such, it is desirable to provide effective edge termination designs for SiC-SJ devices to ensure reliable and robust device operation during reverse bias.

BRIEF DESCRIPTION

In an embodiment, a SiC-SJ device includes a plurality of SiC semiconductor layers of a first conductivity-type, wherein a first and a second SiC semiconductor layer of the plurality of SiC semiconductor layers comprise a termination region disposed adjacent to an active region with an interface formed therebetween, wherein the termination region of the first and the second SiC semiconductor layers comprises a plurality of implanted regions of a second conductivity-type, and wherein an effective doping profile of the termination region of the first SiC semiconductor layer is different from an effective doping profile of the termination region of the second SiC semiconductor layer.

In another embodiment, a silicon carbide (SiC) super-junction (SJ) device includes a first SiC semiconductor layer of a first conductivity-type, wherein the first SiC semiconductor layer comprises a first plurality of implanted regions of a second conductivity-type that form an active region and a termination region of the first SiC semiconductor layer, wherein the termination region of the first SiC semiconductor layer has a first effective doping profile. The device includes at least one second SiC semiconductor layer of the first conductivity-type disposed below the first SiC semiconductor layer and closer to a substrate layer than the first semiconductor layer, wherein the at least one second SiC semiconductor layer includes a second plurality of implanted regions of the second conductivity-type that form a second active region and a second termination region of the at least one second SiC semiconductor layer, wherein the second termination region of the at least one second SiC semiconductor layer has a second effective doping profile that is different from the first effective doping profile.

In another embodiment, a method of manufacturing a silicon carbide (SiC) super-junction (SJ) device includes fabricating a lower SiC semiconductor layer of the SiC-SJ device by: forming the lower SiC semiconductor layer having a first conductivity-type on top of a SiC substrate layer; fabricating an active region in the lower SiC semiconductor layer by forming a first plurality of implanted regions having a second conductivity-type in a portion of the lower SiC semiconductor layer; and fabricating a termination region in the lower SiC semiconductor layer by forming a second plurality of implanted regions having the second conductivity-type in another portion of the lower SiC semiconductor layer adjacent the active region according to a first effective doping profile. The method further includes fabricating a top SiC semiconductor layer of the SiC-SJ device by: forming the top SiC semiconductor layer having the first conductivity-type above the lower SiC semiconductor layer; fabricating an active region in the top SiC semiconductor layer by forming a third plurality of implanted regions having the second conductivity-type in a portion of the top SiC semiconductor layer; and fabricating a termination region in the top SiC semiconductor layer by forming a fourth plurality of implanted regions having the second conductivity-type in another portion of the top SiC semiconductor layer adjacent the active region according to a second effective doping profile, wherein the first effective doping profile is different from the second effective doping profile.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
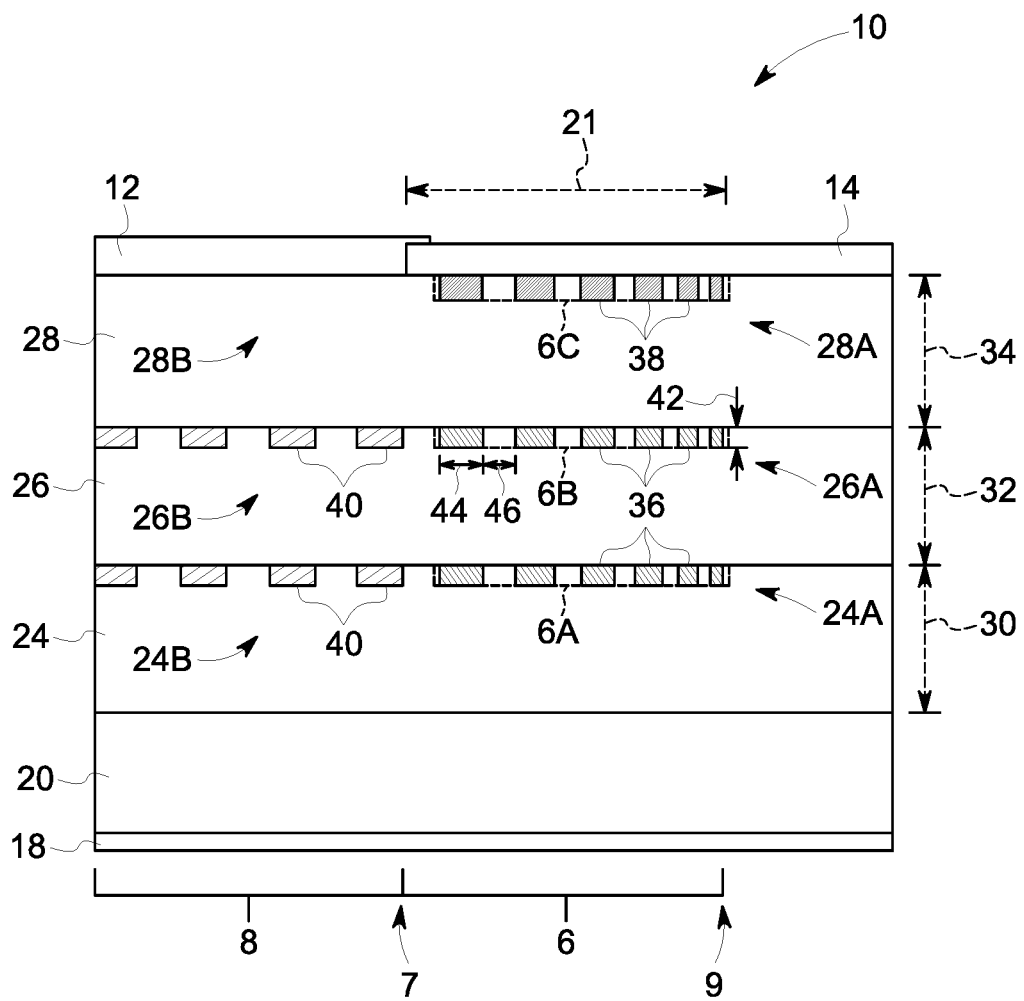
FIG. 1 is a schematic illustrating a cross-sectional view of a portion of a multi-layer silicon carbide super-junction (SiC-SJ) Schottky diode having a termination region that includes floating regions of doping, in accordance with some embodiments of the present approach.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also when introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. If ranges are disclosed, the endpoints of all ranges directed to the same component or property are inclusive and independently combinable. The modifier "about" used in connection with a quantity is inclusive of the stated value and has the meaning dictated by the context (e.g., includes the degree of process variations or errors associated with measurement of the particular quantity). The modifier "substantially," when used in combination with a descriptive term, is intended to convey that the descriptive terms mostly, mainly, or predominately applies (e.g., applies to greater than 90%, greater than 95%, or greater than 99% of the time), and may be used to account for limited exceptions that may result from process variations and technical limitations understood by those of the art.

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness. Furthermore, the term "a layer" as used herein refers to a single layer or a plurality of layers, unless the context clearly dictates otherwise.

As used herein, the term "disposed on" refers to layers disposed directly in contact with each other or indirectly by having intervening layers there between, unless otherwise specifically indicated. The term "adjacent" as used herein means that the two layers are disposed contiguously and are in direct contact with each other.

In the present disclosure, when a layer/device is being described as "on" another layer or substrate, it is to be understood that the layers/devices can either be directly contacting each other or have one (or more) layer or feature between the layers and devices. Further, the term "on" describes the relative position of the layers/devices to each other and does not necessarily mean "on top of" since the relative position above or below depends upon the orientation of the device to the viewer. Moreover, the use of "top," "bottom," "above," "below," "upper", "buried" and variations of these terms is made for convenience, and does not require any particular orientation of the components unless otherwise stated. With this in mind, as used herein, the terms "lower," "buried," "middle," or "bottom" refer to a feature (e.g., epitaxial layer, termination region) that is relatively nearer the substrate layer, while the terms "top" or "upper"

refer to the particular feature (e.g., epitaxial layer, termination region) that is relatively the farthest from the substrate layer.

As used herein, the term "adjacent" or "proximate" when used in context of discussion of different compositions or structure of regions or surfaces refers to "immediately next to" and it also refers to the situation wherein other components that are present between the components under discussion do not vary much with regards to the compositions or structure respectively of at least any one of the components.

Present embodiments are directed toward designs and methods for manufacturing SiC vertical charge-balance devices, also referred to as SiC super-junction (SiC-SJ) devices. The disclosed designs and methods are useful in the manufacture of SiC-SJ devices, such as metal-oxide-semiconductor field-effect transistors (MOSFETs), junction field effect transistors (JFETs), bipolar junction transistors (BJTs), diodes, as well as other SiC-SJ devices that may be useful for medium-voltage (e.g., 2 kV-10 kV) and high-voltage (e.g., greater than or equal to 10 kV) power conversion related applications. As discussed below, the disclosed SiC-SJ device designs include multi-layered termination regions implemented using repeated epitaxial growth and dopant implantation steps. As used herein, the term "multi-layered," as well as references to a particular number of layers, for example, "two-layered," "three-layered," "four-layered," refer to the number of epitaxial SiC layers, also referred to herein as epi layers.

The disclosed SiC-SJ designs and manufacturing techniques enable the effective edge termination of SiC-SJ devices, despite the aforementioned low diffusion coefficients and ion implanted range of dopants in SiC compared to Si. Generally speaking, the disclosed termination designs satisfy a number of design parameters to provide effective edge termination for a SiC-SJ device. For example, the disclosed termination designs provide a blocking voltage that is close to device entitlement. The disclosed termination designs are also relatively robust to process variations (e.g., dopant concentration in the implanted regions, dopant concentration in the epitaxial layers, doping activation percentage, etc.). Further, the disclosed termination designs provide stable long-term operation at rated voltages (e.g., 3 kV and above). Additionally, the disclosed termination designs consume a small portion of the die area and are relatively low-cost to fabricate. For example, certain disclosed SiC-SJ device embodiments may be manufactured using common semiconductor fabrication equipment, such as high-volume ion implantation systems used by existing Si/SiC device manufacturing, to provide additional cost benefits.

As discussed in detail below, the disclosed SiC-SJ termination designs include one or more regions of n-type and/or p-type doping arranged in specific ways to allow gradual reduction of the magnitude of the electric field outside of the active region of a SiC-SJ device under high voltage blocking operation. In various embodiments, these regions of doping may be implemented as disconnected blocks, continuous pillars, stripes, segments, grids, dots, or any other suitable shape. In certain embodiments, these regions of doping may be described as "floating," meaning that they are in not in electrical contact with a device terminal or under an external applied bias; however, in other embodiments at least a portion of these regions may be in electrical contact with a device terminal. The positions and dimensions of these implanted regions in the termination region of the disclosed SiC-SJ devices are designed to achieve a high blocking voltage, to prevent premature device breakdown that results from electric field crowding effects, and to allow reliable operation of these devices particularly when subjected to long-term high-temperature/high-voltage operation.

FIG. 1 is a schematic illustrating a cross-sectional view of the termination region 6 and the active region 8 for an embodiment of a SiC-SJ device 10 (i.e., a Schottky diode), in accordance with embodiments of the present approach. The illustrated portion of the SiC-SJ device 10 includes a top contact 12 and dielectric layer 14, and includes a bottom contact 18 disposed below a SiC substrate layer 20. Additionally, the termination region 6 of the SiC-SJ device 10 has a width ($W_t$) that extends from the interface 7 (i.e., where the active region 8 and the termination region 6 meet) to an outer end 9 of the termination region 6.

The illustrated SiC-SJ device 10 includes three epitaxial SiC layers: 24, 26, and 28. Portions of the epi layers in the termination region 6 of the device 10 are referred to herein as the termination regions 24A, 26A, and 28A of SiC layers 24, 26, and 28, respectively. Additionally, the termination region 6 may be described herein as having or including the termination region 6a of the epi layer 24, the termination region 6b of the epi layer 26, and the termination region 6c of the epi layer 28. Portions of these epi layers disposed in the active region 8 of the device 10 are referred to herein as the active regions 24B, 26B, and 28B of the epi layers 24, 26, and 28, respectively. In other embodiments, the SiC-SJ device 10 may include any suitable number of epi layers, for example, 3, 4, 5, 6 or more; each including respective active and termination regions to provide desirable blocking capability. In an example embodiment, the blocking capability provided by the number of epi layers is in the range of about 2 kV to about 10 kV. For the SiC-SJ device 10 illustrated in FIG. 1, epi layer 24 has a thickness 30, epi layer 26 has a thickness 32, and epi layer 28 has a thickness 34, which are discussed in greater detail below.

Each of the epi layers 24, 26, and 28 of the illustrated SiC-SJ device 10 has a specific doping concentration of a first dopant type, and the doping concentration of these epi layers may be the same, in certain embodiments, or may be different, in certain other embodiments. Additionally, the epi layers 24, 26, and 28 include implanted regions of a second dopant type, opposite to the first dopant type, that are utilized to reshape the electric field in the SiC-SJ device 10. In certain embodiments, these implanted regions include floating regions 36 and 38, are implemented in the form of disconnected blocks for the device 10 of FIG. 1. When the floating regions 36, 38 are arranged in specific ways, they gradually reduce the strength of the electric field outside of the active region 8 of the SiC-SJ device 10 under high-voltage blocking operation. For the illustrated SiC-SJ device 10, epi layers 24 and 26 also include charge-balance regions 40, which are implanted regions of the second dopant type that define the electric field distribution in the active region 8 of the SiC-SJ power device 10. In certain embodiments, the charge balance regions 40 may be floating regions of doping, as illustrated in FIG. 1 and as disclosed in the co-pending U.S. patent application Ser. No. 14/752,446, entitled, "ACTIVE AREA DESIGNS FOR SILICON CARBIDE SUPER-JUNCTION POWER DEVICES," filed Jun. 26, 2015, which is incorporated by reference in its entirety for all purposes. In other embodiments, the active region 8 may include continuous, non-floating charge-balance pillars of doping, or any other suitable charge-balance or super-junction features, in accordance with the present disclosure. For the illustrated SiC-SJ Schottky device 10, the active region 28B the epi layer 28 does not include doped regions; however, for other types of SiC-SJ devices (e.g., SJ-MOS- FETs, SJ-UMOSFETs, SJ-JFETs, SJ-Junction Barrier Controlled Schottky (JBS) diodes), the active region 28B may include doped regions or other suitable features, in accordance with the present disclosure.

In general, as mentioned, the floating regions 36 and 38 of the illustrated SiC-SJ device 10 are regions having opposite doping (e.g., opposite dopant type) compared to the epi layers 24, 26, and 28, in which they reside. When the embodiment of the SiC-SJ device 10 illustrated in FIG. 1 is in an OFF-state under reverse bias, floating regions 36 and 38 deplete to provide ionized dopants (immobile charges) that, when suitably arranged, allow the electric field to be reshaped within periphery of active region 8 (i.e., within the termination region 6). More specifically, when regions 36 and 38 deplete under reverse bias, they prevent electric field peaks and provide electric field distributions with a magnitude that gradually decreases with increasing distance from the active region 8 of the SiC-SJ device 10. As discussed below, the particular electric field distribution in the termination region 6 of the SiC-SJ device 10 under reverse bias depends, for example, on the distribution of dopants (e.g., dopant concentration, the dimensions, and the positions of the floating regions 36 and 38).

For the embodiment of the SiC-SJ device 10 illustrated in FIG. 1, the floating regions 36 and 38 have a particular thickness 42. In other embodiments, the floating regions 36 and 38 may extend through the entire thickness of their respective epitaxial layers (e.g., thicknesses 30, 32, and 34) to form continuous, pillars of doping, as discussed herein with respect to FIG. 3. Additionally, for the illustrated embodiment of FIG. 1, the widths 44 of the floating regions 36 and 38, and the spacing 46 between the floating regions 36 and 38 in the termination region 6 changes (e.g., decreases or increases) with increasing distance from the active region 8 of the SiC-SJ device 10 to provide a gradual decrease in effective sheet doping concentration in the termination region 6. It may be appreciated that, in other embodiments, the widths 44 of the floating regions 36 and 38 substantially decrease with increasing distance from the active region 8, while the spacing 46 between the floating regions 36 and 38 remains substantially constant. In still other embodiments, the spacing 46 between the floating regions 36 and 38 substantially increases with increasing distance from the active region 8, while the widths 44 of the floating regions 36 and 38 remains substantially constant. In certain embodiments, the widths 44 may be between approximately 0.8 µm and approximately 5 µm. Additionally, in certain embodiments, the spacing 46 may generally be less than the thickness of the respective epi layer (e.g., less than the thickness 30, 32, or 34). Further, in certain embodiments, the floating regions 36 and 38 of each epi layer 24, 26, and 28 may have different thicknesses 42, widths 44, and spacing 46. Additionally, in certain embodiments, multiple masking/lithographic steps may be used to fabricate a termination region of an epi layer (e.g., termination regions 24A, 24B, and 24C).

Figure 2:
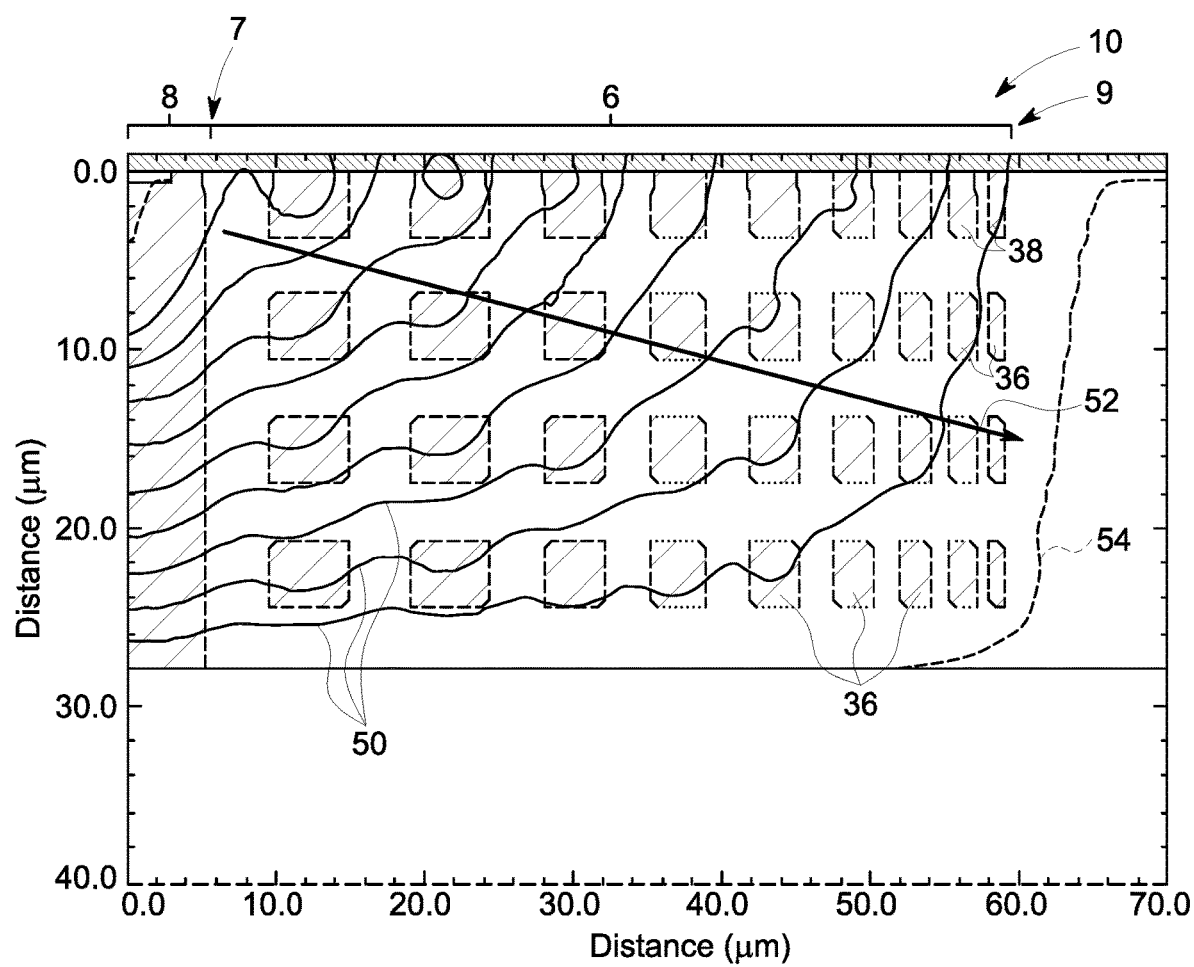
FIG. 2 is a schematic illustrating the termination region for an embodiment of the SiC-SJ device in the form of floating regions of doping, including equipotential lines demonstrating the electric field present under reverse bias conditions.

FIG. 2 illustrates a cross-sectional view of an embodiment of a SiC-SJ device 10 having a termination region 6 that includes floating regions 36 and 38, implemented as disconnected blocks of doping. Additionally, FIG. 2 includes equal potential lines 50 that also indicate the electric field present in the termination region 6 of the SiC-SJ device 10 under reverse bias conditions. The strength of the equal potential lines 50 is represented as being stronger when the lines are close to one another and weaker when there is larger spacing between the lines 50. It may be noted that the active region 8 of the SiC-SJ device 10 of FIG. 2 is represented by a solid block for simplicity; however, as discussed herein, the active region 8 may include any suitable charge-balance features, in accordance with presently disclosed embodiments. As seen in FIG. 2, the floating regions 36 and 38 of the termination region 6 of the illustrated SiC-SJ device 10 enable effective reshaping of the electric field outward from the active region 8 of the device. As indicated by the arrow 52 of FIG. 2, the strength of the electric field generally decreases with increasing distance from the active region 8 until the strength of the field is sufficiently decreased substantially negated, as illustrated by the dashed line 54 of FIG. 2.

Figure 3:
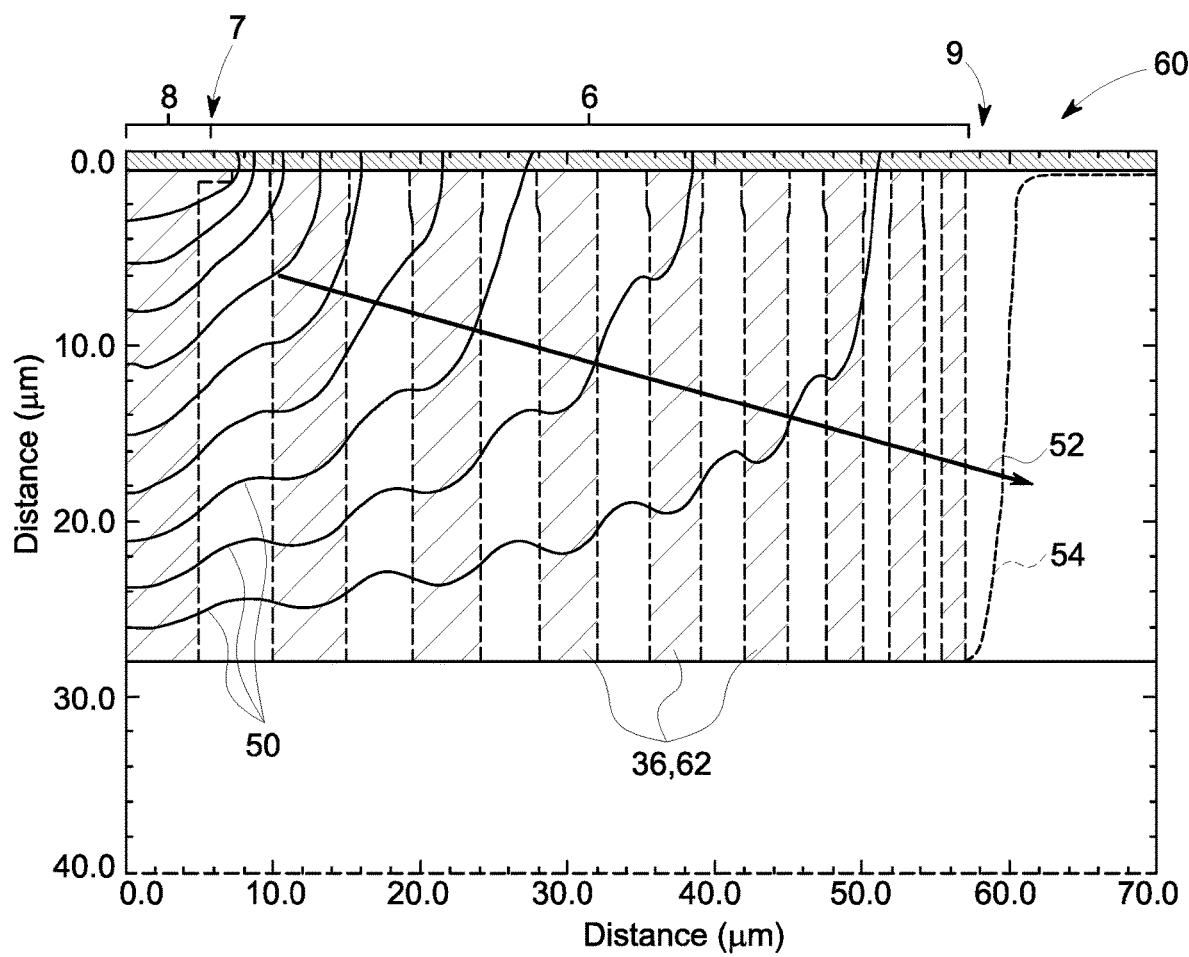
FIG. 3 is a schematic illustrating the termination region for an embodiment of a SiC-SJ device having a termination region with regions of doping in the form of continuous pillars, including equipotential lines demonstrating the electric field present under reverse bias conditions.

For comparison, FIG. 3 illustrates a cross-sectional view of another embodiment of a SiC-SJ device 60 having a termination region 6 that includes floating regions 36 in the form of continuous, vertical pillars 62, which extend through all of the epi layers in the termination region 6 (e.g., through thicknesses 30, 32, and 34, as illustrated in FIG. 1). Like FIG. 2, FIG. 3 includes equal potential lines 50 that represent the electric field present in the termination region 6 of the SiC-SJ device 10 under reverse bias conditions. Like the floating regions 36 and 38 of FIG. 2, the continuous pillars 62 in the termination region 6 of the illustrated SiC-SJ device 60 enables effective reshaping of electric field outward from the active region 8 of the device. As indicated by the arrow 52 of FIG. 3, the strength of the electric field generally decreases with increasing distance from the active region 8 until the strength of the field is sufficiently decreased, as illustrated by the dashed line 54 of FIG. 3. Accordingly, both the floating regions 36 and 38 of the SiC-SJ device 10 of FIG. 2 and the continuous pillars 62 of the SiC-SJ device 60 of FIG. 3 can provide effective edge termination.

In certain embodiments, the floating regions 36 and 38, implemented as disconnected blocks of doping in termination region 6 of the SiC-SJ device 10 of FIG. 1, represent a significantly easier structure to fabricate relative to the continuous pillars embodiment of the SiC-SJ device 60 of FIG. 3. That is, in order to form the continuous pillars 62 for the SiC-SJ device 60, the ion implantation process should provide sufficient implantation energies such that the dopants are able to penetrate to the bottom of each respective epi layer, or numerous thin epi growth steps should be followed by shallow ion implantation steps, in order to provide continuous pillars 62 that extend through the entire thickness of all epi layers of the termination region 6.

As set forth above, in SiC a penetration depth of approximately 1 µm is achievable using implantation energies (e.g., 380 keV) provided by high-volume ion implantation tools, and, as such, each epi layer of the SiC-SJ device 60 should maintain a thickness less than or equal to 1 µm to make use of such tools. However, in general, the combined thickness of all of the epi layers of a SiC-SJ device should generally be thicker than approximately 20 µm to provide a desirable blocking voltage (BV) of approximately 3 kV or more. As such, for a SiC-SJ device 60 utilizing continuous pillars 62 that is fabricated using high-volume ion implantation tools, this could involve approximately 30 repeated SiC epitaxial growth and ion implantation steps. Alternatively, the continuous pillars 62 could be formed using specialty or custom implantation tools that enable higher implantation energies (e.g., greater than 380 keV) such that the structure may be fabricated in fewer steps. However, it should be appreciated that high-energy ion implantation involves special masking techniques using masking materials such as silicon on insulator (SOI), polysilicon, high-Z (atomic number) metals (e.g., platinum, molybdenum, gold, etc.), thick silicon oxide, or organic materials (e.g., polyimide) to define cell pitches between approximately 2 µm and 50 µm. In contrast, the floating regions 36 and 38, implemented as disconnected blocks of doping of the SiC-SJ device 10, are easier to manufacture utilizing lower cost processes (e.g., high-volume implantation tools), and still offer performance advantages over conventional one-dimensional (1-D) parallel plane junction designs.

Figure 4A:
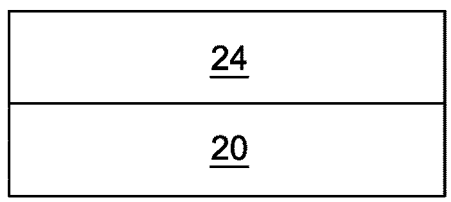
FIGS. 4A-4E are schematics illustrating several steps related to the formation of the termination region of an embodiment of the SiC-SJ device of FIG. 1.
Figure 4B:
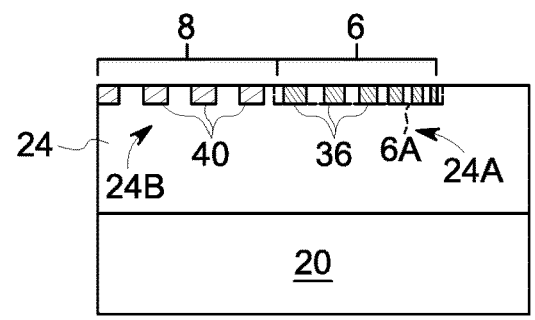

FIGS. 4A-E illustrate cross-sectional views of an embodiment of the SiC-SJ device 10 of FIG. 1 at various stages during an example method of fabrication including the termination region formation. The example fabrication begins with the structure illustrated in FIG. 4A, in which epi layer 24 has been formed on top of the SiC substrate layer 20, for example, using chemical vapor deposition (CVD). Subsequently, as illustrated in FIG. 4B, ion implantation may be used to form the termination region 6a in the termination region 24A, as well as to form the active region 24B, of the epi layer 24. In particular, floating regions 36 may be implanted in the termination region 24A and charge-balance regions 40 may be implanted in the active region 24B of the epi layer 24. In certain embodiments, the termination region 24A and the active region 24B in the epi layer 24 may be formed using the same implantation step, while, in other embodiments, they may be formed using separate implantation steps. In other embodiments, as mentioned above, the floating regions 36 of the termination region 6a and/or the charge-balance regions 40 of the active region 24B may extend through the entire thickness 30 of the epi layer 24.

Figure 4C:
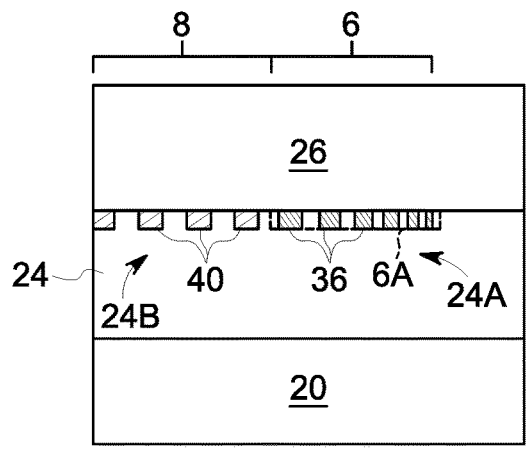
Figure 4D:
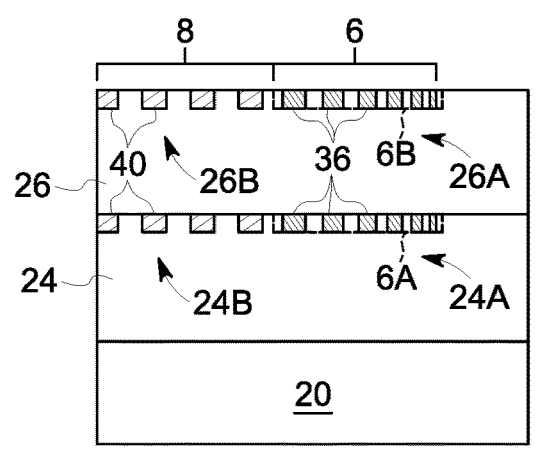

Continuing through the example fabrication, as illustrated in FIG. 4C, next the epi layer 26 is formed on top of the initial layer 24. Subsequently, as illustrated in FIG. 4D, ion implantation may be used to form the termination region 6b and the active region 26B in the epi layer 26. In particular, floating regions 36 may be implanted in the termination region 26A, and charge-balance regions 40 may be implanted in the active region 26B, of the epi layer 26. As with the epi layer 24, in certain embodiments, the termination region 6b and the active region 26B of the epitaxial layer 26 may be formed using the same implantation step, while, in other embodiments, the termination region 6b and the active region 26B of the epi layer 26 may be formed using separate implantation steps. In other embodiments, as mentioned above, the floating regions 36 of the termination 26B and/or the charge-balance regions 40 of the active region 26B may extend through the entire thickness 32 of the epi layer 26 (as illustrated in FIG. 1). It may be appreciated that the steps illustrated in FIGS. 4C and 4D may be repeated multiple times (e.g., 2, 3, 4, 5, or more times) to form larger, multi-layered embodiments of the SiC-SJ structure 10 illustrated in FIG. 1.

Figure 4E:
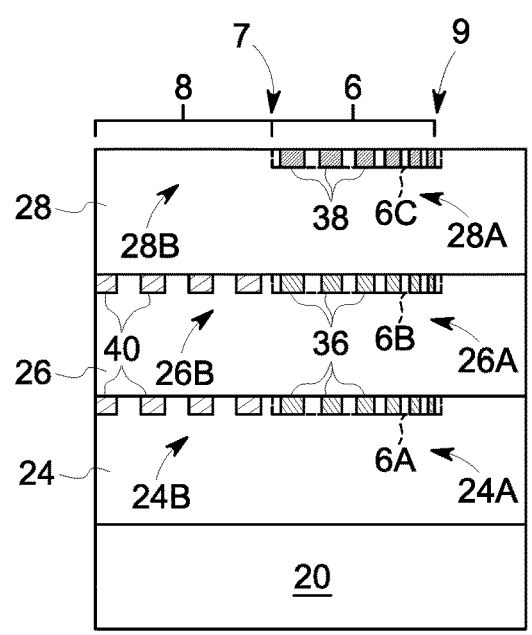

Continuing through the example fabrication, as illustrated in FIG. 4E, next the epi layer 28 is formed on top of the epi layer 26. Subsequently, as illustrated in FIG. 4D, one or more ion implantation steps may be used to form the termination region 6c and the active region 28B in the epitaxial layer 28. As mentioned, while the illustrated active region 28B does not include doped regions; for other types of SiC-SJ devices (e.g., SJ-MOSFETs, SJ-UMOSFETs, SJ-JFETs, SJ-JBS diodes), the active region 28B may include doped regions or other suitable features, in accordance with the present disclosure. Additionally, in other embodiments, as mentioned above, the floating regions 38 of the termination region 6c may extend through the entire thickness 34 of the epi layer 28, as illustrated in FIG. 1. After all of the epi layers (e.g., layers 24, 26, 28) have been formed and implanted, as illustrated in FIG. 4E, the remainder of the SiC-SJ device 10 (e.g., the dielectric layer 14, the top contact 12, the bottom contact 18, etc.) may be added to provide the embodiment of the SiC-SJ device 10 illustrated in FIG. 1.

As mentioned, the regions 36 and 38 in the termination region 6 are implanted with the same dopant type (e.g., a p-type or n-type dopant), and may be implanted utilizing the same materials (e.g. Al, B, N, P, etc.), using the same dose/energy during the same ion implantation step used to fabricate the charge-balance regions 40 in the active region 8, which reduces fabrication time and cost. In other embodiments, the regions in termination region 6 may be implanted using a different dopant material and/or dose/energy, which may increase the fabrication time and cost, but enables greater flexibility for the termination region 6 to be optimized separately from the active region 8 of the SiC-SJ device 10. For example, certain dopants (e.g., boron) diffuse in SiC in a manner that provides wider doping redistribution and/or regions merging, which may be desirable for the termination, but not for the active region 8 of the SiC-SJ device. Accordingly, in certain embodiments, the implanted regions of the termination region 6 may include a different dopant (e.g., boron) than the implanted regions of the active region 8 of the Si-SJ device 10. Further, in certain embodiments, a different set of photolithographic masks may be used to form the charge-balance regions 40 and the regions 36 and 38 in each epi layer (e.g., layers 24, 26, and 28), which enables improved tailoring of the terminations 6a, 6b, and 6c of each epi layer 24, 26, and 28.

One design parameter of the disclosed termination designs is the effective doping profile for the termination of each epi layer of the SiC-SJ device 10. As used herein, the "effective doping profile" of a termination describes how the sheet doping concentration varies with distance along the termination of an epi layer outward from the interface 7 between the active region 8 and the termination region 6 of the epi layers 24, 26, and 28. As used herein, sheet doping concentration (N) may refer to either the average doping concentration per unit area or the effective average doping per unit area for a portion of an epi layer, which may be calculated as discussed below. That is, N represents average doping concentration per unit area when representing a region with uniform conductivity-type; however, for portions of an epi layer that include regions of different conductivity-types, N represents effective sheet doping concentration.

For example, the effective doping profile of termination region 6a describes how the sheet doping concentration of the termination region 6a changes with increasing distance from the interface 7 between the active region 8 and the termination region 6, towards the periphery of the SiC-SJ device 10. It may be appreciated that the terminations of each epi layer (e.g., termination region 6a of epi layer 24, termination region 6b of epi layer 26, termination region 6c of epi layer 28, as illustrated in FIG. 1) may have a different effective doping profile. In particular, the upper (e.g., top, unburied) termination region 6c typically has a different effective doping profile than the lower (e.g., bottom, buried) terminations 6a and 6b. However, as discussed herein, the effective doping profiles of the termination regions in all of the epi layers 24, 26, and 28 have generally downward trend. As such, for the SiC-SJ device 10 of FIG. 1 and the SiC-SJ device of FIG. 3, the effective doping concentration in termination region 6 decreases with increasing distance from the interface 7 between the termination region 6 and the active region 8.

Figure 5:
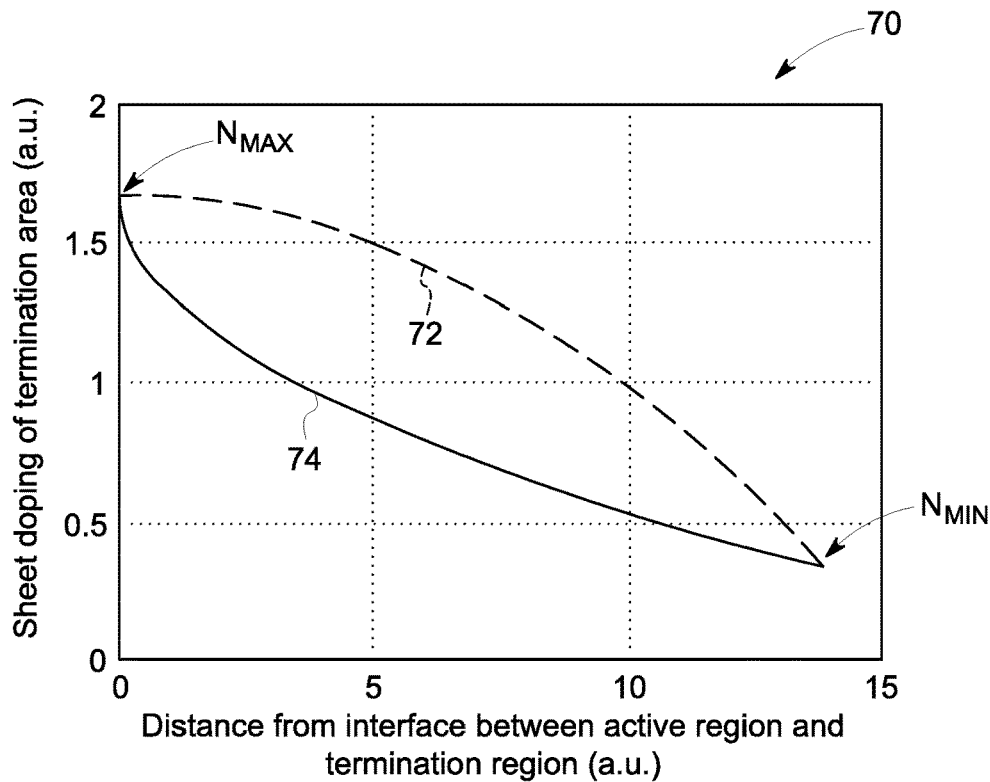
FIG. 5 is a graph that plots an example of an effective doping profile of a termination region of a first (upper, top) epitaxial layer and a termination region of a second (lower, buried) epitaxial layer versus distance from the active region/termination region interface, in accordance with some embodiments of the present approach.

The graph 70 of FIG. 5 plots an example of the effective doping profile for both an upper termination (e.g., termination region 6c of epi layer 28) and a buried termination (e.g., termination region 6a of epi layer 24) for an embodiment of the SiC-SJ device 10. More specifically, the graph 70 plots sheet doping concentration in a portion of the termination of a epi layer (in arbitrary units) versus distance, d, along the termination region 6 (e.g., distance from the interface 7 between the termination region 6 and the active region 8, in arbitrary units). In certain embodiments, the effective doping profile of the first (upper, top) termination region 6c is defined by the curve 72 illustrated in the graph 70 of FIG. 5. The curve 72 represents a fast declining function defined by the following equation:

$$N(d) = N_{max} + (N_{min} - N_{max}) \times \sqrt{\frac{d}{W_t}} \qquad \text{Eq. 1}$$

In certain embodiments, the effective doping profile of a second (lower, buried) termination region 6a or 6b is defined by the curve 74 illustrated in the graph 70 of FIG. 5. The curve 74 represents a slow declining function defined by the following equation:

$$N(d) = N_{max} + (N_{min} - N_{max}) \times \left(\frac{d}{W_t}\right)^2 \qquad \text{Eq. 2}$$

Figure 11:
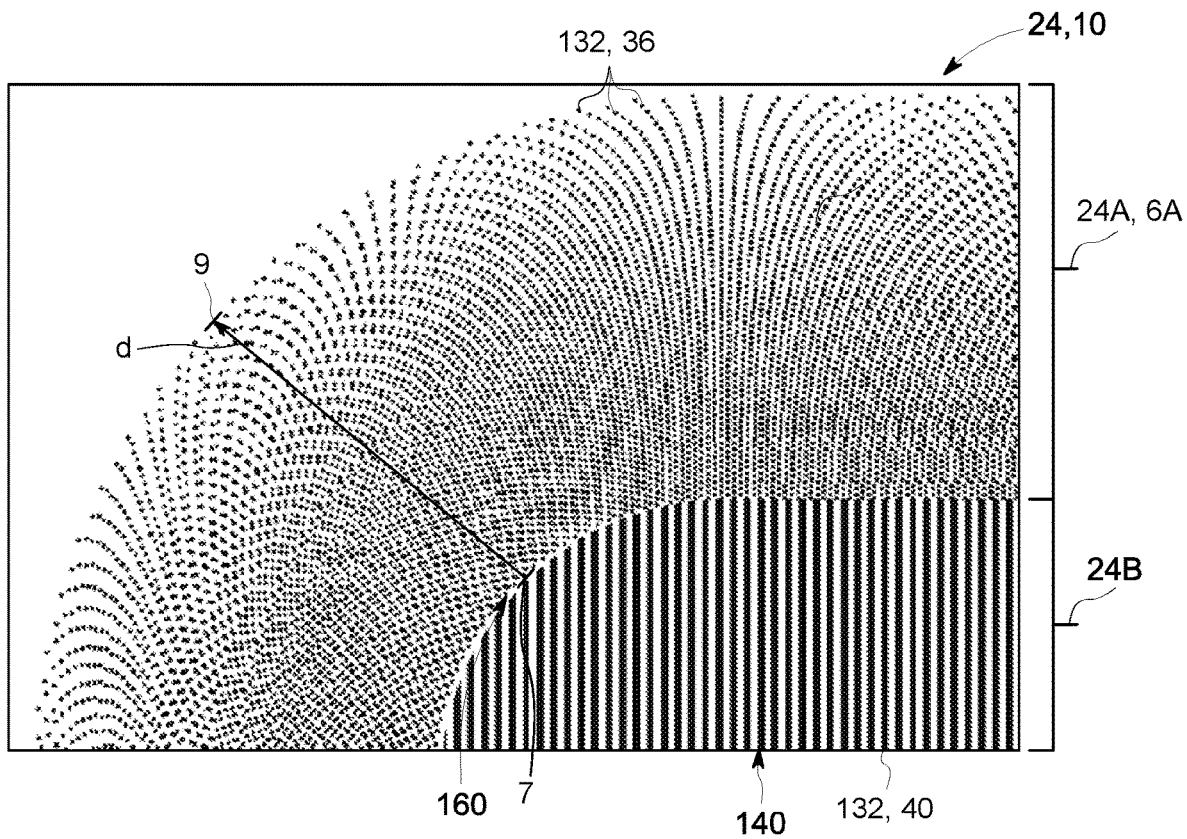
FIG. 11 is a top-down view of a second (lower, buried) epitaxial layer of an embodiment of the SiC-SJ device of FIG. 1 having a graded termination design and an active region with "stripe" cells implanted therein.
Figure 12:
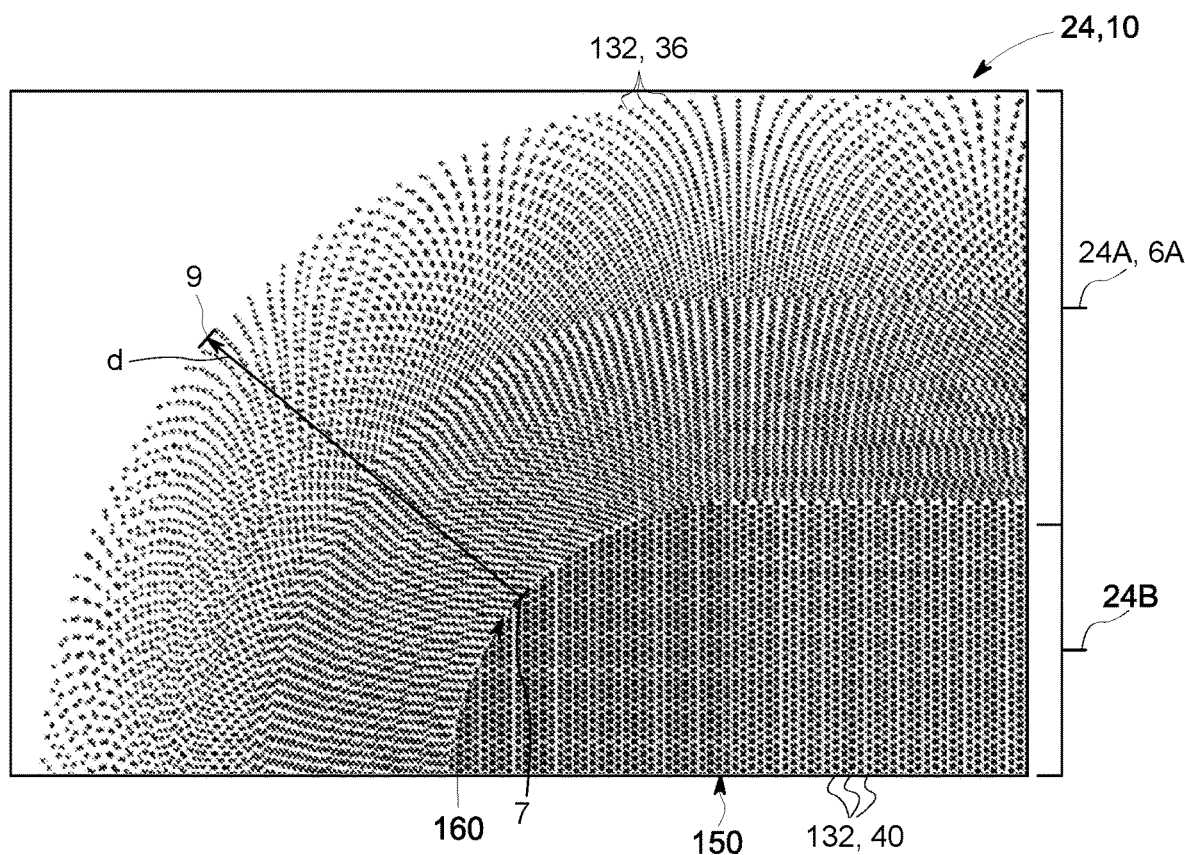
FIG. 12 is a top-down view of a second (lower, buried) epitaxial layer of an embodiment of the SiC-SJ device of FIG. 1 having a graded termination region and an active region having square cells implanted therein.

For both Eq. 1 and Eq. 2, N(d) is the sheet doping of the termination of the epi layer as a function of d, which is the distance along the termination region 6 (e.g., the distance from the interface 7 between the active region 8 and the termination region 6 of the epi layer, as more clearly illustrated in the top-down views of FIGS. 11 and 12). Further, $N_{max}$ is the average doping concentration in the portion of the termination closest to the interface 7 between the active region 8 and the termination region 6, $N_{min}$ is the average doping concentration in the outer end 9 of the termination region 6 of the epi layer, and $W_t$ is the width of the termination region 6. In other embodiments, other doping profiles may include a step function, or a monotonic gradual decrease of sheet doping with increasing distance from the active region 8.

In certain embodiments, for lower epi layers 24 and 26, the effective $N_{max}$ of a termination may be equal to the effective sheet doping of the floating regions 40. For example, the effective sheet doping of the charge-balance regions 40 may be calculated by normalizing the doping concentration of these charge-balance regions 40 to the unit cell area of the SiC-SJ device 10. Alternatively, when ion implantation is used to fabricate the charge-balance regions 40 in the active regions 24B or 26B, the same implantation dose may be used to form termination region.

In certain embodiments, the $N_{max}$ value of the termination region 6c of the upper epi layer 28 may be greater than approximately $6\times10^{12}$ cm$^{-2}$ minus $Q_{interface}$ and less than approximately $3\times10^{13}$ cm$^{-2}$, wherein $Q_{interface}$ is the interfacial charge arising mainly due to one or more of fixed charge or trapped charge. It may be noted that $Q_{interface}$ is not identical to that for buried epi layers 24 and 26 and, therefore, the $N_{max}$ value of the terminations 6a or 6b of the buried epi layers 24 and 26 may be greater than approximately $6\times10^{12}$ cm$^{-2}$ and less than approximately $3\times10^{13}$ cm$^{-2}$. Additionally, the implanted regions 36 in the buried termination regions 26A and 24A may be activated at a different percentage than the implanted regions 38 of the top termination region 28A, which may also create differences between the desired effective doping profile for the upper epi layer versus the lower epi layer(s). Additionally, in certain embodiments, to provide a termination region 6 that is sufficiently insensitive to process variations, while occupying a sufficiently small die area, $N_{min}$ may be maintained between approximately 10% and approximately 50% of $N_{max}$, and $N_{min}$ may be greater than or equal to $N_{epi}$, which is the sheet doping concentration of a semiconductor layer after epitaxial growth. Additionally, in certain embodiments, the width of the termination region 6, $W_t$, may be between approximately two times and approximately five times the total thickness of one of the SiC epitaxial layers. For example, for the SiC-SJ device 10 illustrated in FIG. 1, the width of the termination region 6, $W_t$, may be between about two times and five times the thickness of one of the SiC epitaxial layers 24, 26, or 28 (e.g., thickness 30, 32, or 34).

Figure 6:
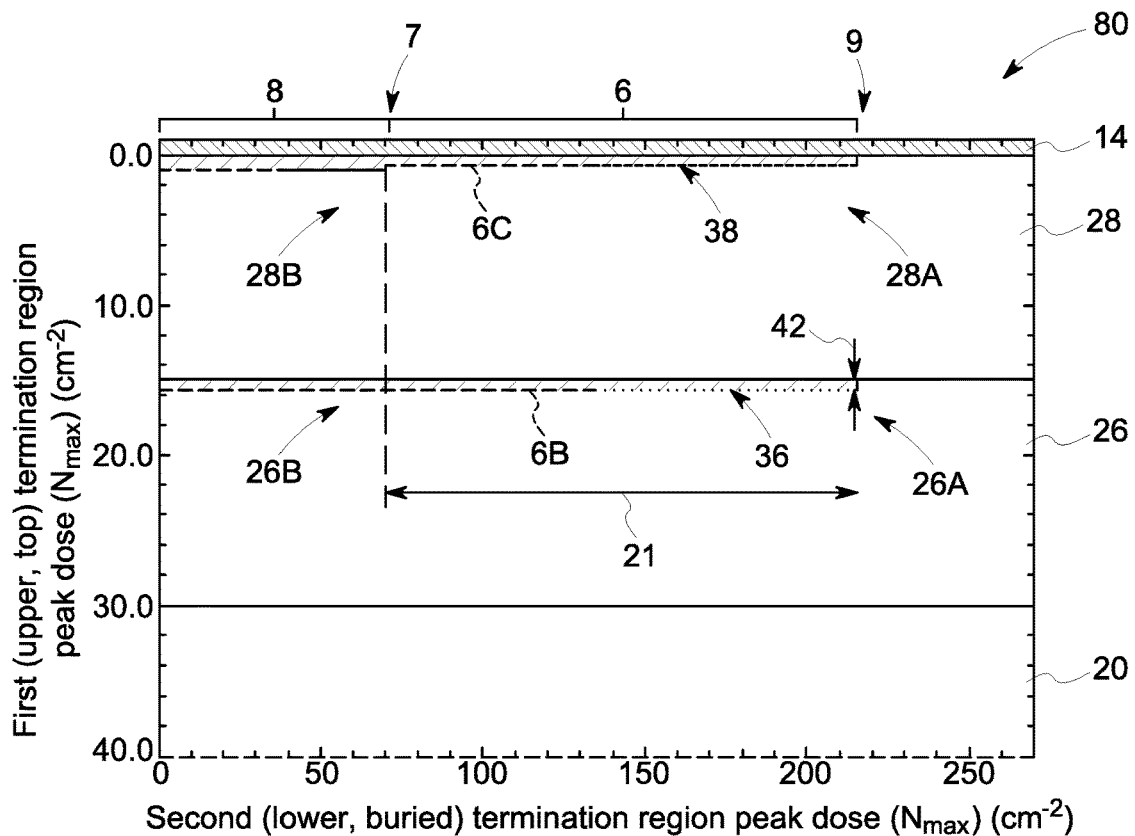
FIG. 6 is a schematic illustrating a cross-sectional view of a portion of an example embodiment of a two-layered 3.3 kV SiC-SJ device.

FIG. 6 is a schematic that illustrates a cross-sectional view of a portion of an embodiment of a two-layer 3.3 kV SiC-SJ device 80. The SiC-SJ device 80 illustrated in FIG. 6 includes two epi layers: a second (lower, buried) epi layer 26 disposed on a SiC substrate layer 20 and a first (upper, top) epi layer 28, disposed on the second epi layer 26. The second (lower) epi layer 26 includes a termination region 6b and an active region 26B, and the first (upper)epi layer 28 includes a termination region 6c and an active region 28B. Additionally, while the termination regions 6b and 6c are illustrated as solid blocks for simplicity, it should be noted that the terminations 6b and 6c include implanted regions, like regions 36 and 38 as illustrated in FIG. 1. Additionally, for the SiC-SJ device 80 illustrated in FIG. 6, the two epi layers 26 and 28 each have a thickness of about 15 μm, the thickness 42 of the implanted regions is about 1 μm, and $W_t$ for each of the terminations regions 6b and 6c is in the range of about 60 μm to about 150 μm. Additionally, the effective doping profile for the termination region 6b corresponds to the curve 74 in FIG. 5, and the effective doping profile for the termination region 6c corresponds to the curve 72 in FIG. 5, wherein $N_{min}$ is about 20% of $N_{max}$ and $Q_{interface}=0$.

Figure 7:
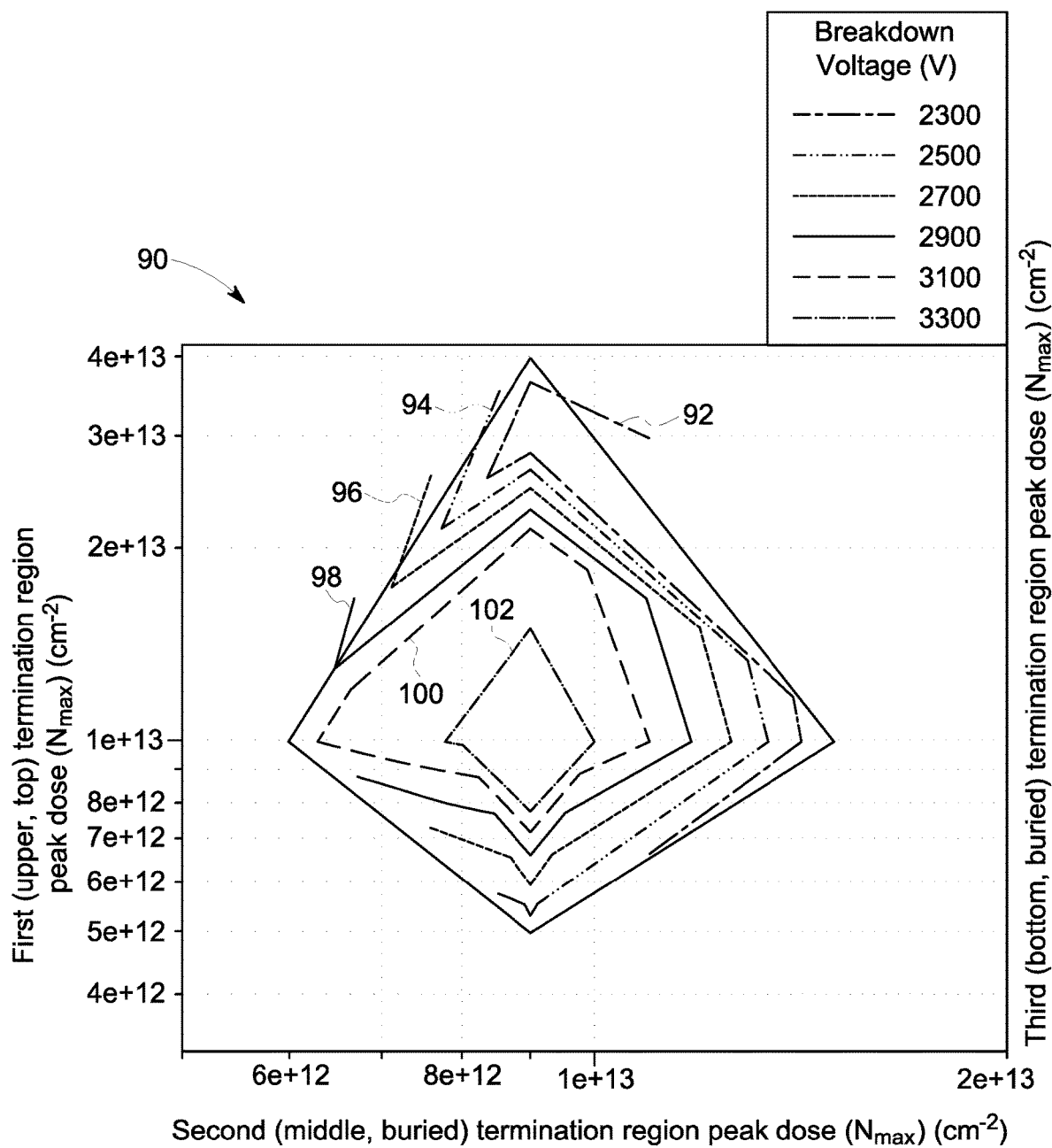
FIG. 7 is an example of a breakdown voltage contour plot for the embodiment of the SiC-SJ device of FIG. 6 illustrating the breakdown voltage dependence of the SiC-SJ device of FIG. 6 versus peak dose ($N_{max}$) of the termination regions in the first (upper, top) and second (lower) SiC epitaxial layers.

FIG. 7 is a breakdown voltage sensitivity contour plot 90 for the embodiment of the SiC-SJ device 80 of FIG. 6, illustrating different breakdown voltage contours for different $N_{max}$ in the upper termination region 6c (upper termination region peak dose on the vertical axis) and different $N_{max}$ in the lower termination region 6b (lower termination region peak dose on the horizontal axis). Each curve of the plot 90 represents a different breakdown voltage (i.e., curve 92 representing 2.3 kV; curve 94 representing 2.5 kV; curve 96 representing 2.7 kV; curve 98 representing 2.9 kV; curve 100 representing 3.1 kV; curve 102 representing 3.3 kV). As illustrated by the plot 90, the embodiment of the SiC-SJ device 80 provides a breakdown voltage greater than 3.3 kV when $N_{max}$ of the lower termination region 6b is between approximately $8\times10^{12}$ cm$^{-2}$ and approximately $1\times10^{13}$ cm$^{-2}$ and the $N_{max}$ of the upper termination region 6c is between approximately $8\times10^{12}$ cm$^{-2}$ and approximately $1.4\times10^{13}$ cm$^{-2}$.

Figure 8:
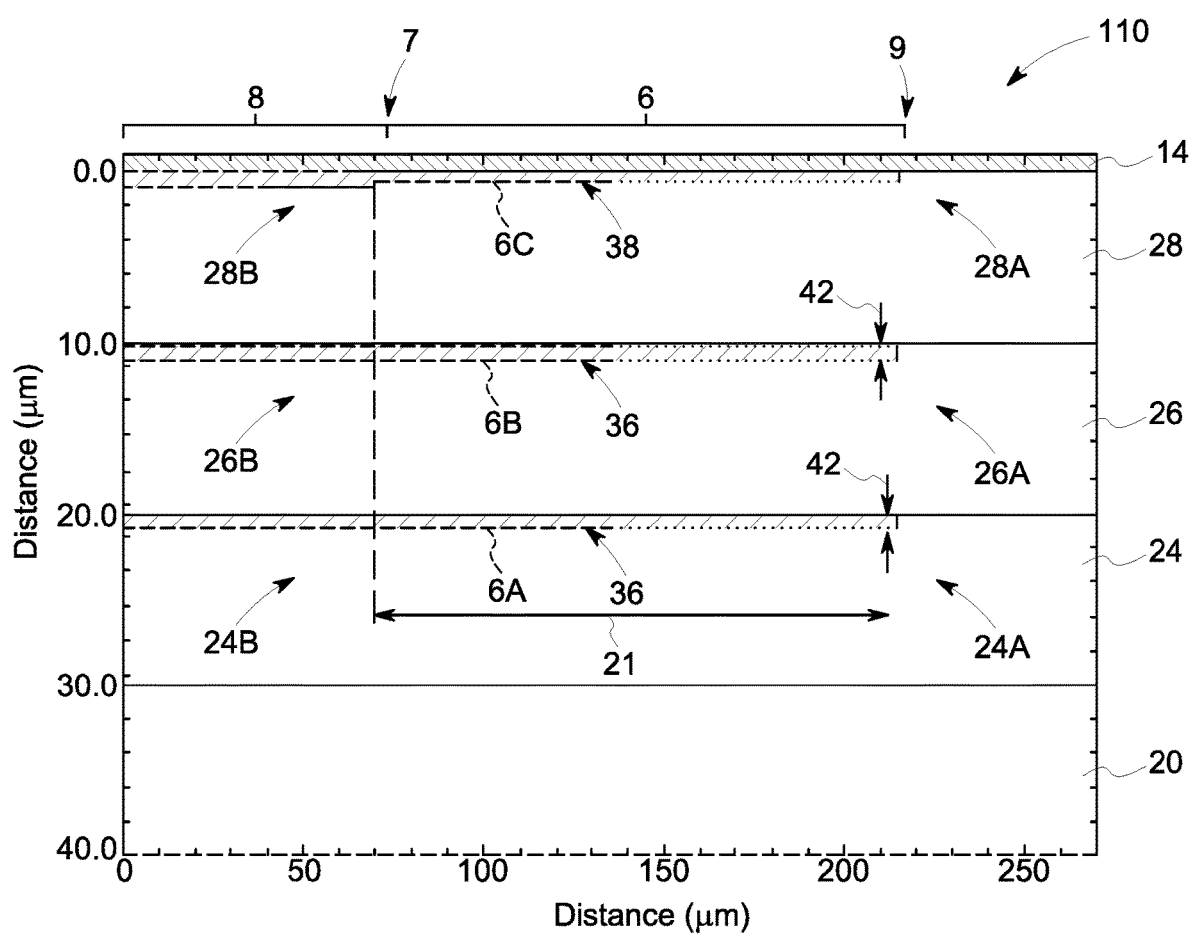
FIG. 8 is a cross-sectional view of the termination region of an example embodiment of a three-layered 3.3 kV SiC-SJ device.

FIG. 8 is a schematic that illustrates a cross-sectional view of a portion of an embodiment of a three-layer 3.3 kV SiC-SJ device 110. The SiC-SJ device 110 illustrated in FIG. 8 includes three epi layers: a third (lower) epi layer 24 disposed on a SiC substrate layer 20, a second (middle) epi layer 26 disposed above the layer 24, and a first (upper) epi layer 28 disposed above the layer 26. The lower epi layer 24 includes a termination region 6a and an active region 24B, the middle epi layer 26 includes a termination region 6b and an active region 26B, and the upper epi layer 28 includes a termination region 6c and an active region 28B. Additionally, while the terminations 6a, 6b, and 6c of the epi layers 24, 26, and 28 are illustrated as solid blocks for simplicity, it should be noted that the terminations 6a, 6b, and 6c of the SiC-SJ device 110 illustrated in FIG. 8 can be represented by implanted regions, similar to floating regions 36 and 38 illustrated in FIG. 1. Additionally, for the SiC-SJ device 110 illustrated in FIG. 8, the three epi layers 24, 26, and 28 each have a thickness of 10 μm (as indicated by the y-axis), the thickness 42 of the implanted regions in the termination regions 6a and 6b is 1 μm, and $W_t$ for the terminations 6a, 6b, and 6c is 140 μm. Additionally, the effective doping profile for the upper termination region 6c corresponds to the curve 72 in FIG. 5, and the effective doping profiles for the buried terminations 6a and 6b correspond to the curve 74 in FIG. 5, wherein $N_{min}$ is 20% of $N_{max}$ and $Q_f=0$.

Figure 9:
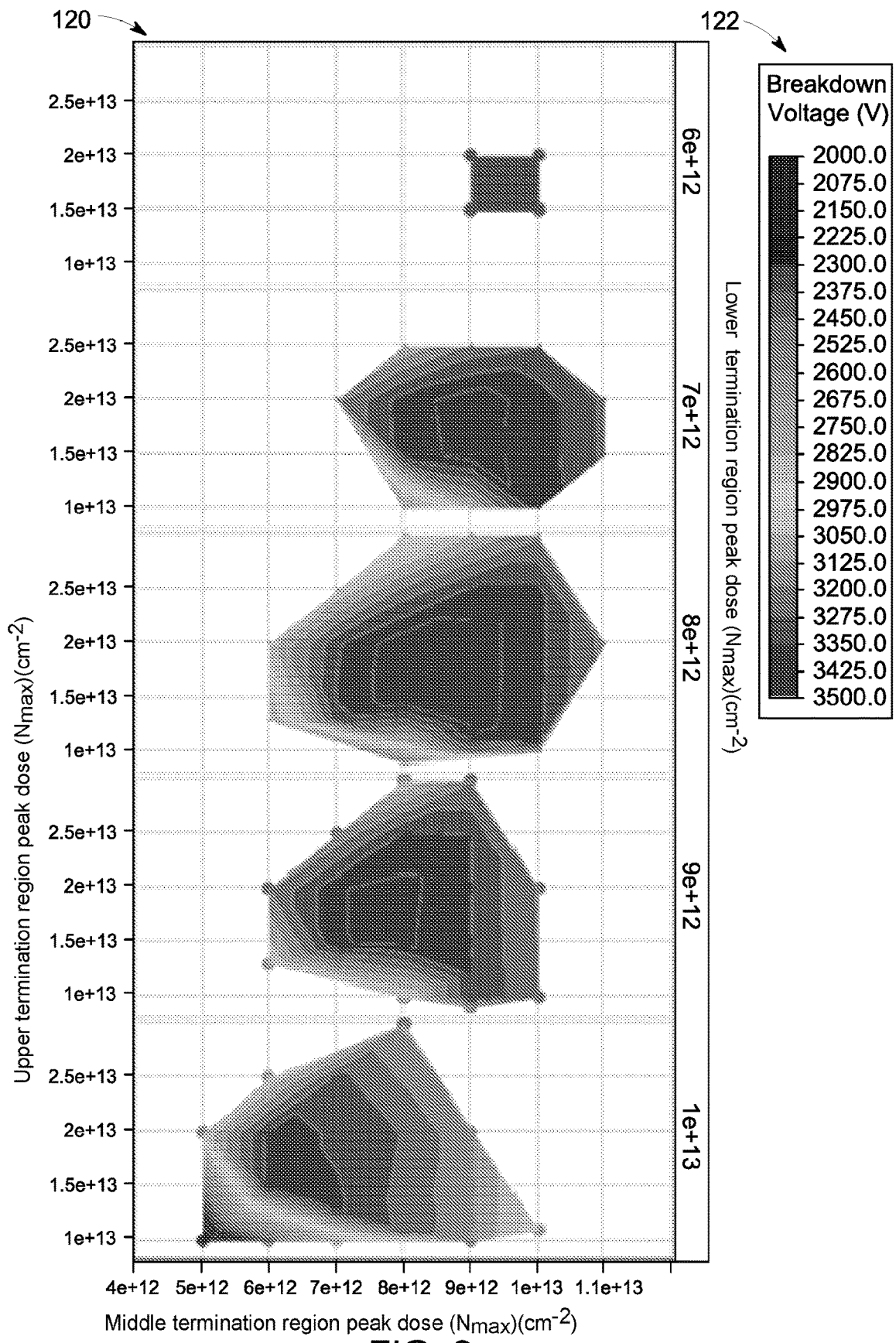
FIG. 9 is an example of a breakdown voltage contour plot for the embodiment of the SiC-SJ device of FIG. 8 illustrating the breakdown voltage dependence on peak dose ($N_{max}$) of termination regions in first (upper, top), second (middle, buried), and third (lower, buried) SiC semiconductor layers.

FIG. 9 is a breakdown voltage sensitivity contour plot 120 for the SiC-SJ device 110 of FIG. 8, illustrating different breakdown voltage contours for different $N_{max}$ in the upper termination region 6c (upper termination peak dose on the left vertical axis), for different $N_{max}$ in the lower termination region 6a (lower termination peak dose on the right vertical axis), and for different $N_{max}$ in the middle termination region 6b (middle termination peak edose on the horizontal axis). As illustrated by the key 122, each shaded region of the plot 120 represents a different breakdown voltage range ranging from 2 kV to 3.5 kV. Similar to the plot 90 of FIG. 7, the plot 120 of FIG. 9, demonstrates that the embodiment of the SiC-SJ device 110 illustrated in FIG. 8 provides a breakdown voltage greater than 3.3 kV when the $N_{max}$ of the lower and middle terminations 6a and 6b is between approximately $7 \times 10^{12}$ cm$^{-2}$ and approximately $1 \times 10^{13}$ cm$^{-2}$ and the $N_{max}$ of the upper termination region 6c is between approximately $1.2 \times 10^{13}$ cm$^{-2}$ and approximately $2.3 \times 10^{13}$ cm$^{-2}$.

Figure 10:
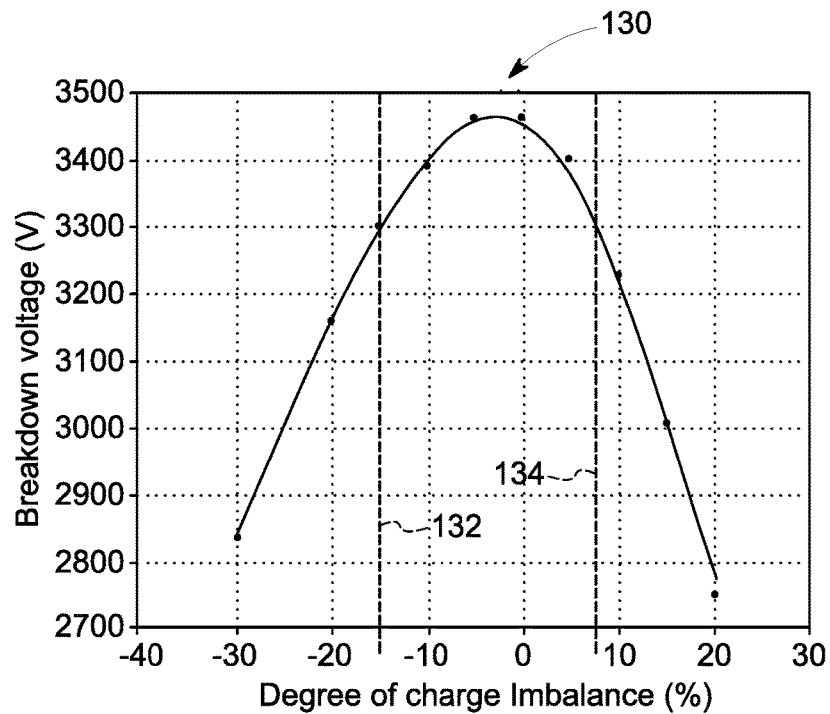
FIG. 10 is a graph illustrating breakdown voltage versus degree of charge imbalance (%) for certain embodiments of the 3.3 kV SiC-SJ devices illustrated in FIG. 6.

FIG. 10 is a graph 130 plotting breakdown voltage (on the vertical axis) versus degree of charge imbalance (in percent (%) on the horizontal axis) for the embodiments of the 3.3 kV SiC-SJ device 110 illustrated in FIG. 8. As used herein, charge imbalance refers to the degree of deviation in sheet doping in the termination of an epi layer from a target value. A certain degree of charge imbalance may be present in the embodiments of the SiC-SJ device 110 due to variations in the dopant concentration of terminations 6a, 6b, or 6c and/or variations in the dopant concentration in the epi layers 24, 26, or 28. As illustrated by vertical lines 132 and 134 in FIG. 10, the SiC-SJ device 110 is able to provide a breakdown voltage of greater than or equal to 3.3 kV even when the charge provided by the terminations 6a, 6b, and 6c of the termination region 6 is unbalanced (e.g., over the range approximately ±10% away from optimal).

FIGS. 11-15 illustrate top-down views (perpendicular to cross-sectional view of FIG. 1) of portions SiC-SJ devices 10, in accordance with embodiments of the present approach. More specifically, FIGS. 11-15 illustrate top-down views of example buried epi layers (e.g., portion of epi layer 24) for embodiments of the SiC-SJ device 10. In FIGS. 11-15, each shaded region (e.g., black pixel or square) represents an implanted region 130 (e.g., p-type region, such as the implanted regions 40 and 36), while the white background represents the remainder of the epi layer (e.g., n-type). In certain embodiments, these implanted regions 132 may extend (along the y-axis) through only a portion of the thickness 30 of the layer 24 (e.g., approximately 1 μm or less), as illustrated in FIG. 1, such that the implanted regions 132 of the termination region 6a and/or the implanted regions of the active region 24B of the epi layer 24 appear as disconnected blocks in a cross-sectional view (e.g., as illustrated in FIG. 1). In certain embodiments, these implanted regions may extend (along the y-axis) through the entire thickness 30 of the epi layer 24, such that the implanted regions of the termination region 6a and/or the implanted regions of the active region 24B appear as continuous pillars in a cross-sectional view (e.g., as illustrated in FIG. 3). Additionally, for the epi layers 24 illustrated in FIGS. 11-15, each implanted region receives approximately the same implantation dose, with some tolerance for material and process variation. In other embodiments, multiple masks may be used to implant the termination region 24A and the active region 24B of the epi layer 24, such that different implanted regions may receive different implantation doses.

FIG. 11 illustrates a top-down view of implanted regions 132 in buried epi layer 24 for an embodiment of the SiC-SJ device 10. In FIG. 11, the illustrated structure includes a graded termination region 6a disposed around the perimeter of the active region 24B of the layer 24. It may be appreciated that the implanted regions 132 of the termination region 6a represent the implanted regions 36, while the implanted regions 132 of the active region 24B represent charge-balance regions 40. Furthermore, in FIG. 11, the implanted regions 132 of the illustrated active region 24B are aligned along the z-axis to form stripe cells 140.

FIG. 12 illustrates a top-down view of another embodiment of implanted regions 132 in buried epi layer 24 for another embodiment of the SiC-SJ device 10. In FIG. 12, the illustrated buried epi layer 24 includes a graded termination region 6a disposed around the perimeter of the active region 24B. Here again, the implanted regions 132 of the illustrated termination region 6a represent the implanted regions 36, while the implanted regions 132 of the illustrated active region 24B represent charge-balance regions 40. Furthermore, in FIG. 12, the implanted regions 132 of the illustrated active region 24B are staggered along the x-axis, yielding square cells 150.

As discussed above with respect to the curve 74 of FIG. 5, the effective doping profile of the termination region 6a dictates how the sheet doping of the termination region 6a decreases with increasing distance from the active region 24B. For the embodiments of the epi layer 24 illustrated in FIGS. 11 and 12, this is achieved by reducing the density of the implanted regions 132 in the termination region 6a (e.g., reducing the number of implanted regions per unit area of the termination region 24A) with increasing distance, d, from the interface 7 between the active region 24B and the termination region 24A. The effective sheet doping concentration in a portion of a termination region 24A may be calculated by multiplying the percentage of the portion of the termination area 6a that has been implanted (i.e., percentage having implanted regions 132) by the total implantation dose. For example, if 20% of a particular portion of the termination region 6a is implanted (i.e., occupied by implanted regions 132), and if the total implantation dose for the termination region 6a is $8 \times 10^{12}$ cm$^{-2}$, the effective sheet doping for the particular portion of the termination region 24A would be $1.6 \times 10^{12}$ cm$^{-2}$ (assuming complete activation of the implanted species). Similarly, as mentioned above, the effective sheet doping concentration in the active region 24B may be calculated by taking the total dopant implantation dose used to implant the charge-balance regions 40 and normalizing to the total active area 24B of the epi layer 24.

In order to provide what may be referred to herein as a "seamless" connection between termination region 6a and the active region 24B, for the illustrated embodiments of the buried epi layers 24 illustrated in FIGS. 11 and 12, the maximum effective dose ($N_{max}$) of the termination and the effective dose (N) of the active region 24B should be approximately the same. This allows reduced or lower electric field peaks at the interface 7 between the active region 8 and the termination region 6. It may be noted that the implanted regions that form blocking (p-n) junction in upper active region of the SiC-SJ device 10 (e.g., the active region 28B of the epi layer 28 illustrated in FIG. 1) may have any suitable sheet doping regardless of the maximum effective dose ($N_{max}$) of the termination region of the upper epi layer.

Figure 13:
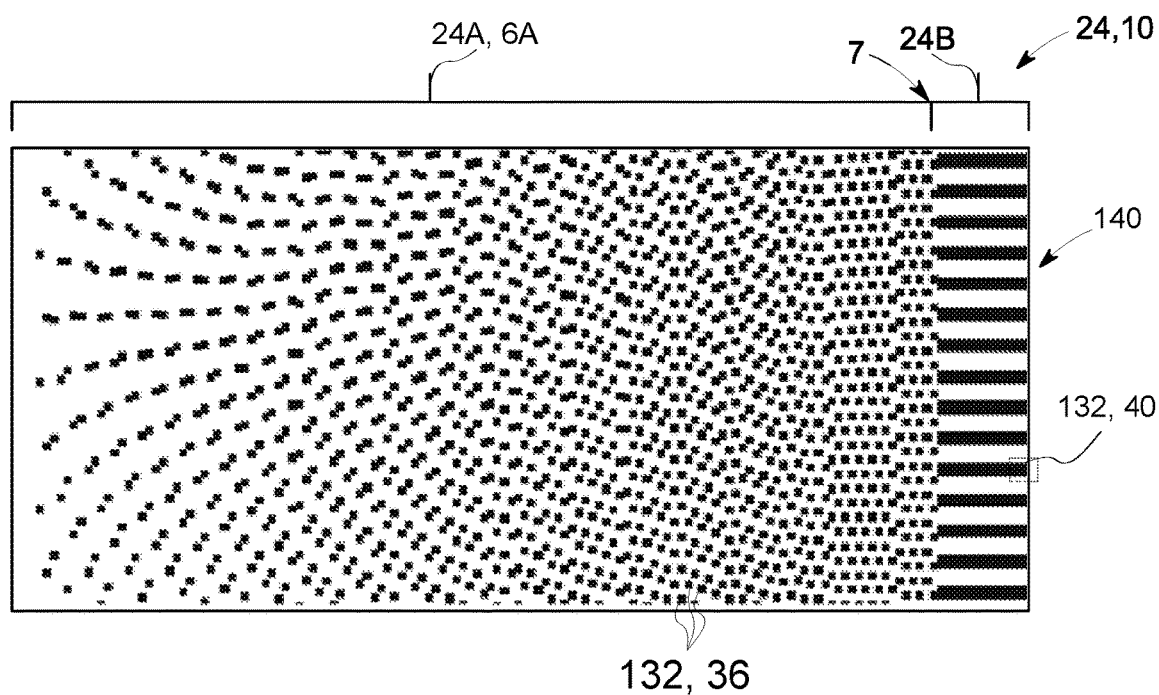
FIGS. 13 and 14 are enlarged views of the interface between the active region and the termination region for the second (lower, buried) epitaxial layer of FIG. 11.
Figure 14:
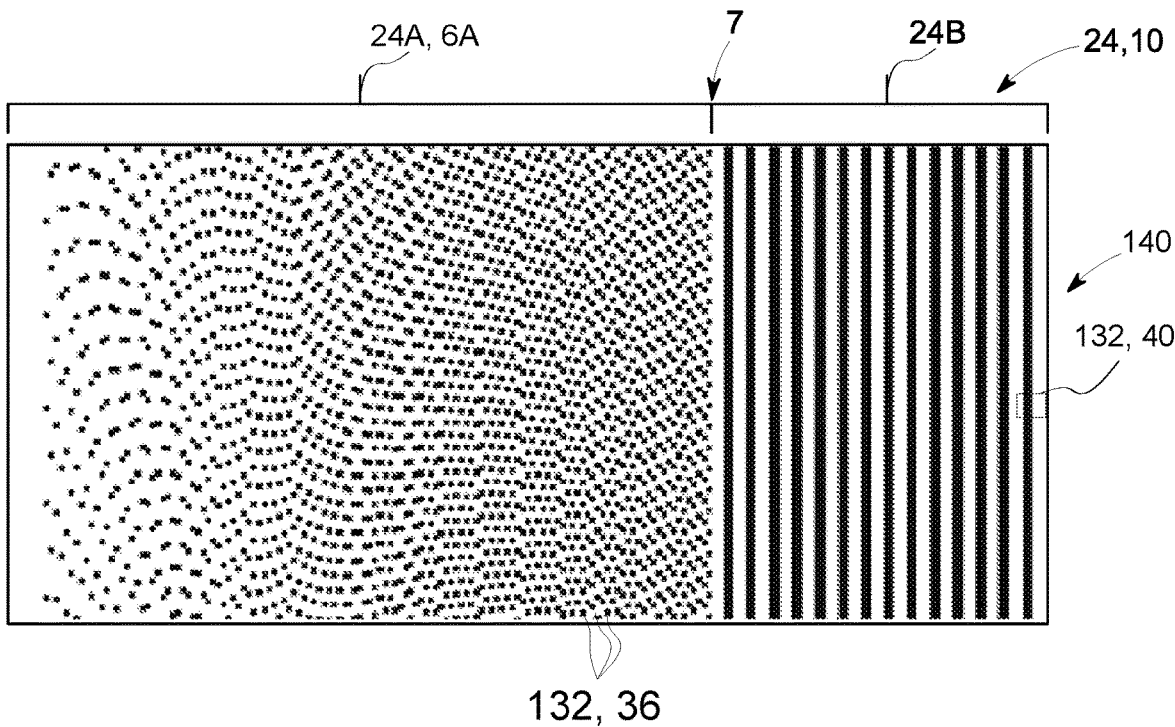
Figure 15:
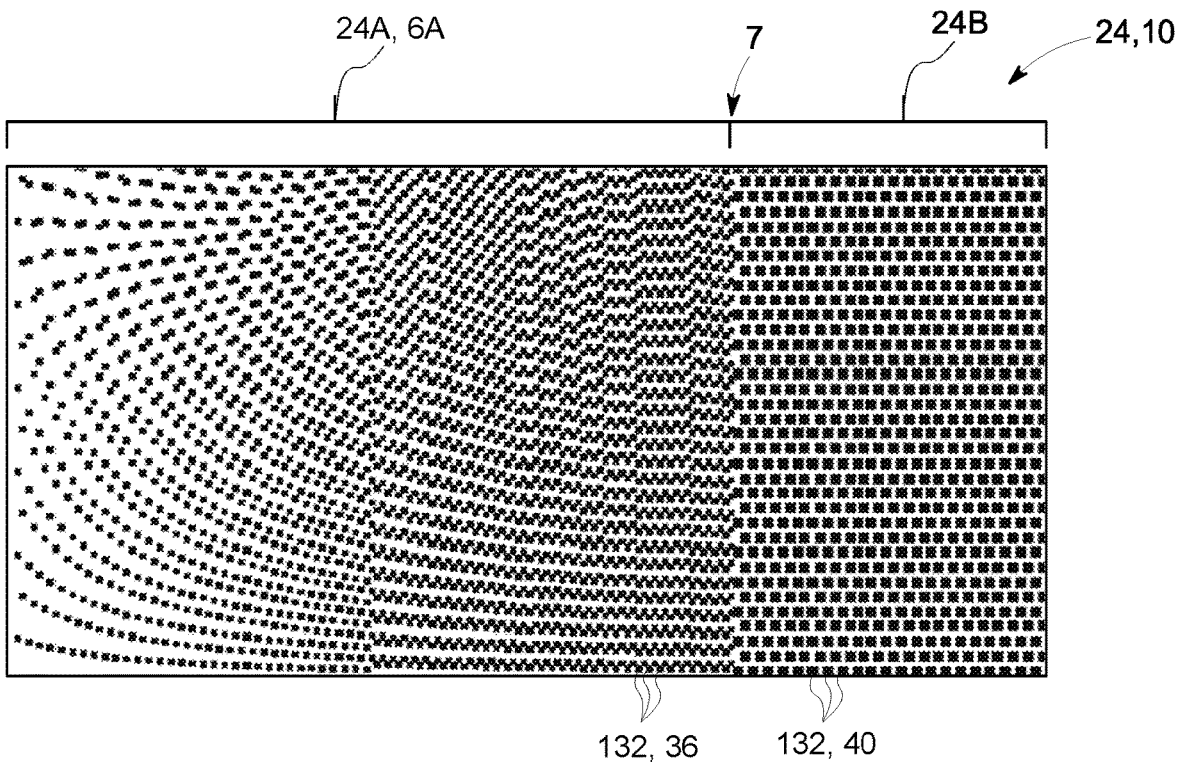
FIG. 15 is an enlarged view of the interface between the active region and the termination region for the second (lower, buried) epitaxial layer of FIG. 12.

Accordingly, as may be seen in the enlarged top-down views of the epi layer 24 of FIG. 11 illustrated in FIGS. 13 and 14, as well as the enlarged top-down views of the epi layer 24 of FIG. 12 illustrated in FIG. 15, by controlling the size, shape, and distances between the implanted regions 132 in the termination region 6a (e.g., implanted regions 36), seamless connections between the termination region 6a and the active region 24B may be achieved. It may also be appreciated that, for the embodiments of the epi layer 24 illustrated in FIGS. 11 and 12, the asymmetry at the curved corner 160 is taken into account such that the maximum effective dose ($N_{max}$) of the termination region 6a and the effective dose (N) of the charge balance regions 40 of the active region 24B substantially match in order to provide a seamless connection between the termination region 6a and the active region 24B, despite the presence of the curved corner 160. It may be appreciated that, in other embodiments, the implanted regions 132 of the termination region 6a and the implanted regions 132 of the active region 24B may be implanted separately, which still may result in a seamless connection, providing that the aforementioned effective dose rule is followed, and also allows for the independent optimization in the termination region 24A and active region 24B utilizing different design rules (e.g., feature sizes), implantation doses/species, and so forth.

Technical effects of the present approach include effective edge termination of SiC-SJ devices despite the low diffusion coefficients of dopants in SiC. The disclosed termination designs provide a blocking voltage that is close to device entitlement and are also relatively robust to process and/or material property variations. Additionally, the disclosed termination designs provide stable long-term operation at rated voltages (e.g., 3 kV and above). Additionally, the disclosed termination designs consume a small portion of the die area and are relatively low-cost to fabricate. Furthermore, certain disclosed SiC-SJ device embodiments may be manufactured using high-volume ion implantation tools using implantation energies of approximately 380 keV or less.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A silicon carbide (SiC) super-junction (SJ) device, comprising:
a plurality of SiC semiconductor layers of a first conductivity-type, wherein a first and a second SiC semiconductor layer of the plurality of SiC semiconductor layers comprise a termination region disposed adjacent to an active region with an interface formed therebetween, wherein the termination region comprises:
a plurality of implanted regions of a second conductivity-type, wherein each of the first and second SiC semiconductor layers includes an equal number of the plurality of implanted regions, and wherein each of the plurality of implanted regions of the first SiC semiconductor layer has a respective width that is substantially equal to, and is substantially aligned with, a respective width of a corresponding implanted region of the plurality of implanted regions of the second SiC semiconductor layer; and
a plurality of spacings respectively disposed between the plurality of implanted regions, wherein each of the plurality of spacings of the first SiC semiconductor layer has a respective spacing width that is substantially equal to, and is substantially aligned with, a respective spacing width of a corresponding spacing of the plurality of spacings of the second SiC semiconductor layer; and
wherein an effective doping profile of the termination region of the first SiC semiconductor layer is different from an effective doping profile of the termination region of the second SiC semiconductor layer.

2. The SiC-SJ device of claim 1, wherein at least a portion of the plurality of implanted regions are floating regions.

3. The SiC-SJ device of claim 1, wherein at least one implanted region of the plurality of implanted regions extends through an entire thickness of the plurality of SiC semiconductor layers.

4. The SiC-SJ device of claim 1, wherein the respective widths of the plurality of implanted regions of the first and the second SiC semiconductor layers are smaller with increasing distance away from the interface along the width of the termination region, and wherein all of the respective spacing widths of the plurality of spacings of the first and the second SiC semiconductor layers are substantially equal.

5. The SiC-SJ device of claim 1, wherein the respective spacing widths of the plurality of spacings of the first and the second SiC semiconductor layer are larger or smaller with increasing distance away from the interface along the width of the termination region, and wherein all of the respective widths of the plurality of implanted regions in the first and the second SiC semiconductor layers are substantially equal.

6. The SiC-SJ device of claim 1, wherein the respective widths of the plurality of implanted regions of the first and the second SiC semiconductor layers are between approximately 0.8 μm and approximately 5 μm.

7. The SiC-SJ device of claim 1, wherein the respective spacing widths of the plurality of spacings of the first or second SiC semiconductor layer is less than a thickness of the first or the second SiC semiconductor layer.

8. The SiC-SJ device of claim 1, wherein a thickness or a doping concentration of the plurality of implanted regions of the first SiC semiconductor layer is different from a thickness or a doping concentration of the plurality of implanted regions of the second SiC semiconductor layer.

9. The SiC-SJ device of claim 1, wherein a combined thickness of all of the plurality of SiC semiconductor layers is greater than about 20 μm.

10. The SiC-SJ device of claim 1, wherein the respective widths of the plurality of implanted regions of the first and the second SiC semiconductor layer are substantially constant along respective thicknesses of the plurality of implanted regions.

11. The SiC-SJ device of claim 1, wherein the plurality of SiC semiconductor layers comprise a third SiC semiconductor layer comprising the plurality of spacings and the equal number of the plurality of implanted regions, wherein each of the plurality of implanted regions of the third SiC semiconductor layer has a respective width that is substantially equal to, and is substantially aligned with, the respective widths of corresponding implanted regions of the first and second SiC semiconductor layers, and wherein each of the plurality of spacings of the third SiC semiconductor layer has a respective spacing width that is substantially equal to, and is substantially aligned with, respective spacing widths of corresponding spacings of the first and second SiC semiconductor layers.

12. A silicon carbide (SiC) super-junction (SJ) device, comprising:
   a first SiC semiconductor layer of a first conductivity-type, wherein the first SiC semiconductor layer comprises a first plurality of implanted regions of a second conductivity-type that form an active region and a termination region of the first SiC semiconductor layer, and a first plurality of spacings respectively disposed between the first plurality of implanted regions, wherein the termination region of the first SiC semiconductor layer has a first effective doping profile; and
   at least one second SiC semiconductor layer of the first conductivity-type disposed below the first SiC semiconductor layer and closer to a substrate layer than the first semiconductor layer, wherein the at least one second SiC semiconductor layer includes a second plurality of implanted regions of the second conductivity-type that form a second active region and a second termination region of the at least one second SiC semiconductor layer, and a second plurality of spacings respectively disposed between the second plurality of implanted regions, wherein the second termination region of the at least one second SiC semiconductor layer has a second effective doping profile that is different from the first effective doping profile; and
   wherein the first plurality of implanted regions of the first SiC semiconductor layer and the second plurality of implanted regions of the second SiC semiconductor layer include an equal number of implanted regions,
   wherein each of the first plurality of implanted regions of the first SiC semiconductor layer has a respective width that is substantially equal to, and is substantially aligned with, a respective width of a corresponding implanted region of the second plurality of implanted regions of the second SiC semiconductor layer, and
   wherein each of the first plurality of spacings of the first SiC semiconductor layer has a respective spacing width that is substantially equal to, and is substantially aligned with, a respective spacing width of a corresponding spacing of the second plurality of spacings of the second SiC semiconductor layer.

13. The SiC-SJ device of claim 12, wherein the first plurality of implanted regions of the active region are aligned to form stripe cells or staggered to form square cells.

14. The SiC-SJ device of claim 12, wherein the first effective doping profile is defined by the equation:

$$N(d) = N_{max} + (N_{min} - N_{max}) \times \sqrt{\frac{d}{W_t}},$$

wherein N(d) is sheet doping density in the termination region of the first SiC semiconductor layer as a function of a distance, d, from the interface between the active region and the termination region of the first SiC semiconductor layer, $N_{max}$ is an average doping concentration of the termination region of the first SiC semiconductor layer at the interface between the active region and the termination region of the first SiC semiconductor layer, $N_{min}$ is an average doping concentration of the termination region of the first SiC semiconductor layer at an outer end of the termination region, and $W_t$ is a width of the termination region of the first SiC semiconductor layer.

15. The SiC-SJ device of claim 14, wherein:

$$3 \times 10^{12} \text{ cm}^{-1} > N_{max} > (6 \times 10^{12} \text{ cm}^{-2} - Q_{interface}),$$

wherein $Q_{interface}$ is interfacial charge.

16. The SiC-SJ device of claim 14, wherein $N_{min}$ is between approximately 10% of $N_{max}$ and approximately 50% of $N_{max}$, and wherein $N_{min}$ is greater than or equal to a first conductivity-type sheet doping concentration of the first SiC semiconductor layer.

17. The SiC-SJ device of claim 12, wherein the second effective doping profile is defined by the equation:

$$N(d) = N_{max} + (N_{min} - N_{max}) \times \left(\frac{d}{W_t}\right)^2,$$

wherein N(d) is sheet doping concentration in the termination region of the at least one second SiC semiconductor layer as a function of a distance, d, from the interface between active region and the termination region of the at least one second SiC semiconductor layer, $N_{max}$ is an average doping concentration of the termination region of the at least one second SiC semiconductor layer at the interface between the active region and the termination region of the at least one second SiC semiconductor layer, $N_{min}$ is an average doping concentration of the termination region of the at least one second SiC semiconductor layer at an outer end of the termination region, and $W_t$ is a width of the termination region of the at least one second SiC semiconductor layer.

18. The SiC-SJ device of claim 17, wherein $N_{max}$ is substantially equal to a maximum effective sheet doping of the active region of the at least one second SiC semiconductor layer, yielding a substantially seamless connection between the active region and the termination region of the at least one second SiC semiconductor layer.

19. The SiC-SJ device of claim 17, wherein:

$$6 \times 10^{12} \text{ cm}^{-2} < N_{max} < 3 \times 10^{12} \text{ cm}^{-2}.$$

20. The SiC-SJ device of claim 17, wherein $N_{min}$ is between approximately 10% of $N_{max}$ and approximately 50% of $N_{max}$, and wherein $N_{min}$ is greater than or equal to a first conductivity-type sheet doping density of the at least one second SiC semiconductor layer.

21. The SiC-SJ device of claim 12, wherein the width of the termination region of the first SiC semiconductor layer and the width of the termination region of the at least one second SiC semiconductor layer is between approximately two and five times a thickness of the first SiC semiconductor layer or a thickness of one of the at least one second SiC semiconductor layer.

22. A method of manufacturing a silicon carbide (SiC) super-junction (SJ) device, comprising:
fabricating a lower SiC semiconductor layer of the SiC-SJ device, comprising:
forming the lower SiC semiconductor layer having a first conductivity-type on top of a SiC substrate layer;
fabricating an active region in the lower SiC semiconductor layer by forming a first plurality of implanted regions having a second conductivity-type in a portion of the lower SiC semiconductor layer; and
fabricating a termination region in the lower SiC semiconductor layer by forming a second plurality of implanted regions having the second conductivity-type in another portion of the lower SiC semiconductor layer adjacent the active region according to a first effective doping profile, wherein the termination region in the lower SiC semiconductor layer comprises a first plurality of spacings respectively disposed between the second plurality of implanted regions; and
fabricating a top SiC semiconductor layer of the SiC-SJ device, comprising:
forming the top SiC semiconductor layer having the first conductivity-type above the lower SiC semiconductor layer;
fabricating an active region in the top SiC semiconductor layer by forming a third plurality of implanted regions having the second conductivity-type in a portion of the top SiC semiconductor layer; and
fabricating a termination region in the top SiC semiconductor layer by forming a fourth plurality of implanted regions having the second conductivity-type in another portion of the top SiC semiconductor layer adjacent the active region according to a second effective doping profile, wherein the first effective doping profile is different from the second effective doping profile, wherein the termination region in the top SiC semiconductor layer comprises a second plurality of spacings respectively disposed between the fourth plurality of implanted regions; and
wherein the second plurality of implanted regions in the lower SiC semiconductor layer and the fourth plurality of implanted regions in the top SiC semiconductor layer include an equal number of implanted regions,
wherein each of the second plurality of implanted regions in the lower SiC semiconductor layer has a respective width that is substantially equal to, and is substantially aligned with, a respective width of a corresponding implanted region of the fourth plurality of implanted regions in the top SiC semiconductor layer, and
wherein each of the first plurality of spacings of the lower SiC semiconductor layer has a respective spacing width that is substantially equal to, and is substantially aligned with, a respective spacing width of a corresponding spacing of the second plurality of spacings of the top SiC semiconductor layer.

23. The method of claim 22, wherein the first plurality and the second plurality of implanted regions are implanted using a first implantation dose and the third plurality and the fourth plurality of implanted regions are implanted using a second implantation dose that is different from the first implantation dose.

24. The method of claim 22, wherein the first, second, third, and fourth plurality of implanted regions are implanted using implantation energies less than approximately 400 keV.

25. The method of claim 22, wherein at least one of the first, second, third, or fourth plurality of implanted regions are implanted using implantation energies greater than approximately 400 keV.

26. The method of claim 22, wherein forming the first plurality and the second plurality of implanted regions comprises implanting the first plurality and the second plurality of implanted regions to a depth less than or equal to approximately 1 µm.

27. The method of claim 22, wherein the first plurality and the second plurality of implanted regions are formed using a single implantation step and the third plurality and the fourth plurality of implanted regions are formed using another single implantation step.

* * * * *